(12) United States Patent
Kato et al.

(10) Patent No.: US 9,932,674 B2
(45) Date of Patent: Apr. 3, 2018

(54) FILM DEPOSITION APPARATUS, FILM DEPOSITION METHOD, AND COMPUTER-READABLE RECORDING MEDIUM

(75) Inventors: Hitoshi Kato, Iwate (JP); Katsuyuki Hishiya, Iwate (JP); Hiroyuki Kikuchi, Iwate (JP); Shigehiro Ushikubo, Iwate (JP); Shigenori Ozaki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 808 days.

(21) Appl. No.: 13/467,324

(22) Filed: May 9, 2012

(65) Prior Publication Data
US 2013/0149467 A1  Jun. 13, 2013

(30) Foreign Application Priority Data

May 12, 2011  (JP) .................................. 2011-107350
Sep. 12, 2011  (JP) .................................. 2011-198396

(51) Int. Cl.
| C23C 16/00 | (2006.01) |
| H01L 21/306 | (2006.01) |
| C23C 16/54 | (2006.01) |
| H01J 37/32 | (2006.01) |
| C23C 16/455 | (2006.01) |

(52) U.S. Cl.
CPC .......... *C23C 16/54* (2013.01); *C23C 16/4554* (2013.01); *H01J 37/321* (2013.01)

(58) Field of Classification Search
CPC ................ H01J 37/321; H01J 37/3211; H01J 37/32119; H01J 37/32128; H01J 37/32137; H01J 37/32146; H01J 37/32155; H01J 37/32165; H01J 37/32174; H01J 37/32183

USPC ...... 118/723 I, 723 IR, 723 AN; 156/345.48, 156/345.49; 315/111.51
See application file for complete search history.

(56) References Cited

U.S. PATENT DOCUMENTS

| 5,234,529 A | 8/1993 | Johnson |
| 5,309,063 A | 5/1994 | Singh |
| 5,560,776 A * | 10/1996 | Sugai .................... H01J 37/321 |
| | | 118/723 AN |

(Continued)

FOREIGN PATENT DOCUMENTS

| CN | 1554114 | 12/2004 |
| CN | 1871685 | 11/2006 |

(Continued)

*Primary Examiner* — Luz L Alejandro Mulero
(74) *Attorney, Agent, or Firm* — IPUSA, PLLC

(57) ABSTRACT

A film deposition apparatus includes a vacuum chamber into which first and second gases are sequentially supplied for a plural times, a rotation table including a first surface having a receiving area and rotating the receiving area inside the vacuum chamber, a first part supplying the first gas to a first region, a second part supplying the second gas to a second region separated from the first region in a peripheral direction of the rotation table via a separation region, a plasma gas part supplying a plasma generation gas into a plasma region inside the vacuum chamber, an antenna facing the first surface of the rotation table and generating plasma from the plasma generation gas inside a plasma space by inductive coupling, and a faraday shield being grounded and provided between the antenna and the plasma space and including slits aligned in a direction perpendicularly intersecting the antenna.

20 Claims, 35 Drawing Sheets

(56) References Cited

U.S. PATENT DOCUMENTS

| | | | |
|---|---|---|---|
| 5,619,103 A * | 4/1997 | Tobin et al. | 315/111.21 |
| 6,000,360 A * | 12/1999 | Koshimizu | 118/723 E |
| 6,024,826 A * | 2/2000 | Collins et al. | 156/345.37 |
| 6,149,760 A * | 11/2000 | Hama | 156/345.48 |
| 6,213,050 B1 * | 4/2001 | Liu et al. | 118/723 IR |
| 6,232,236 B1 | 5/2001 | Shan et al. | |
| 6,287,435 B1 | 9/2001 | Drewery et al. | |
| 6,322,661 B1 * | 11/2001 | Bailey et al. | 156/345.49 |
| 6,417,626 B1 * | 7/2002 | Brcka et al. | 315/111.51 |
| 6,451,161 B1 | 9/2002 | Jeng et al. | |
| 6,869,641 B2 | 3/2005 | Schmitt | |
| 6,905,625 B2 | 6/2005 | Okumura et al. | |
| 7,153,542 B2 | 12/2006 | Nguyen et al. | |
| 7,232,767 B2 | 6/2007 | George et al. | |
| 2002/0092618 A1 | 7/2002 | Collins | |
| 2002/0129903 A1 * | 9/2002 | Davis | H01J 37/32082 156/345.48 |
| 2004/0050329 A1 | 3/2004 | Ikeda | |
| 2004/0058293 A1 | 3/2004 | Nguyen et al. | |
| 2004/0163595 A1 * | 8/2004 | Edamura | H01J 37/321 118/723 I |
| 2005/0022933 A1 | 2/2005 | Howard | |
| 2006/0177579 A1 * | 8/2006 | Shin et al. | 427/248.1 |
| 2007/0054044 A1 | 3/2007 | Shimosaki et al. | |
| 2007/0102119 A1 | 5/2007 | Ikeda | |
| 2008/0026162 A1 | 1/2008 | Dickey et al. | |
| 2010/0062602 A1 * | 3/2010 | Sakamoto et al. | 438/694 |
| 2010/0229797 A1 | 9/2010 | Kato et al. | |
| 2010/0310771 A1 | 12/2010 | Lee | |
| 2011/0048326 A1 | 3/2011 | Kato et al. | |
| 2011/0155057 A1 | 6/2011 | Kato et al. | |
| 2011/0204023 A1 | 8/2011 | Huh et al. | |
| 2012/0021252 A1 | 1/2012 | Lee | |
| 2012/0138450 A1 | 6/2012 | Davis | |
| 2012/0273130 A1 | 11/2012 | Drewery et al. | |
| 2013/0047923 A1 | 2/2013 | Kato et al. | |
| 2013/0059415 A1 | 3/2013 | Kato et al. | |
| 2013/0130512 A1 | 5/2013 | Kato et al. | |
| 2013/0149467 A1 | 6/2013 | Kato et al. | |

FOREIGN PATENT DOCUMENTS

| | | |
|---|---|---|
| CN | 102002685 | 4/2011 |
| CN | 102110572 | 6/2011 |
| JP | H08-213378 | 8/1996 |
| JP | H09-008014 | 1/1997 |
| JP | 3144664 | 3/2001 |
| JP | 2006-522490 | 9/2006 |
| JP | 2007-247066 | 9/2007 |
| JP | 2007-305981 | 11/2007 |
| JP | 2008-130651 | 6/2008 |
| JP | 2008-248281 | 10/2008 |
| JP | 2008-251830 | 10/2008 |
| JP | 2008-288437 | 11/2008 |
| JP | 2009-076876 | 4/2009 |
| JP | 2010-212105 | 9/2010 |
| JP | 2010-239102 | 10/2010 |
| JP | 2010-245448 | 10/2010 |
| JP | 2011-040574 | 2/2011 |
| JP | 2011-071123 | 4/2011 |
| JP | 2011-132589 | 7/2011 |
| JP | 2011-151343 | 8/2011 |
| JP | 2013-045903 | 3/2013 |
| TW | 201102456 | 1/2011 |
| TW | 201126601 | 8/2011 |
| TW | 201326458 | 7/2013 |
| WO | 2004/090943 | 10/2004 |
| WO | 2005/052982 | 6/2005 |
| WO | 2011/022612 | 2/2011 |
| WO | 2011/069011 | 6/2011 |

* cited by examiner

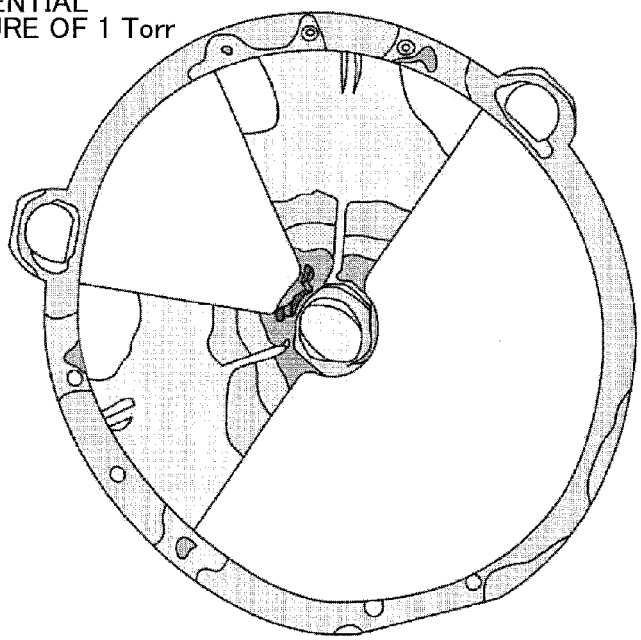
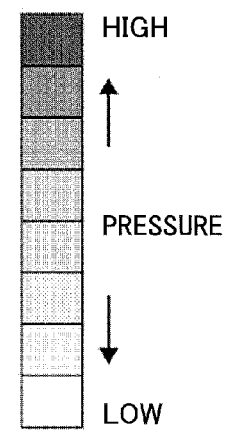
FIG.29
DURING DIFFERENTIAL PRESSURE OF 1 Torr
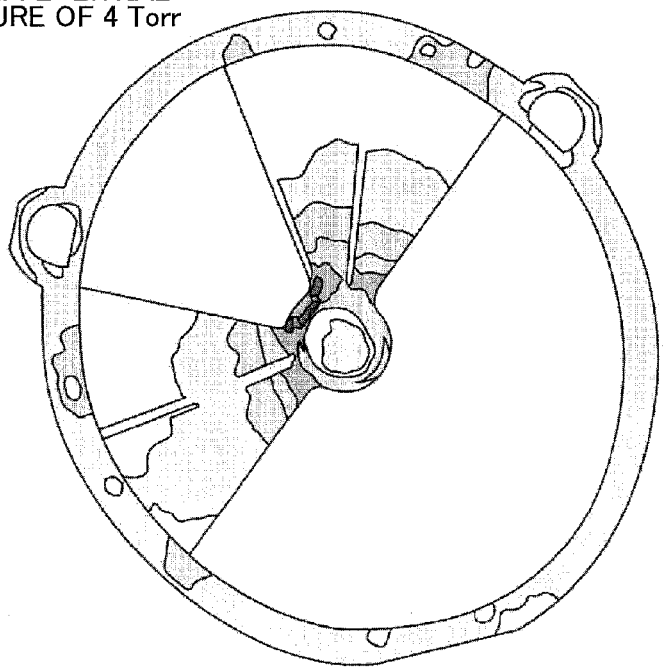
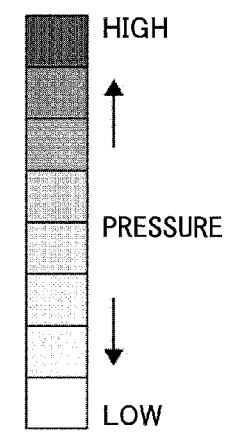
FIG.30
DURING INTERLOCK WITH DIFFERENTIAL PRESSURE OF 4 Torr

FIG.31
DURING INTERLOCK
WITH DIFFERENTIAL
PRESSURE OF 4 Torr
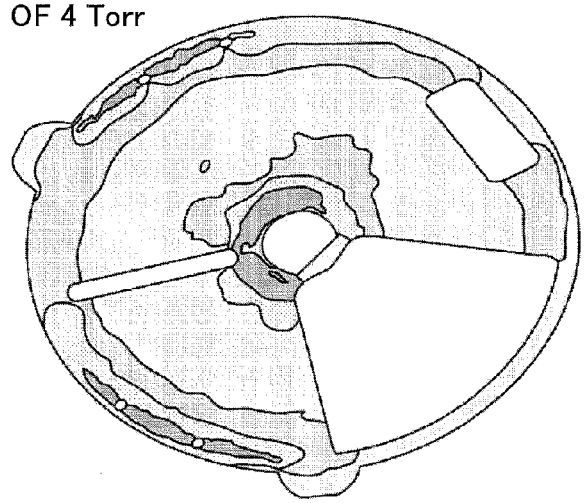
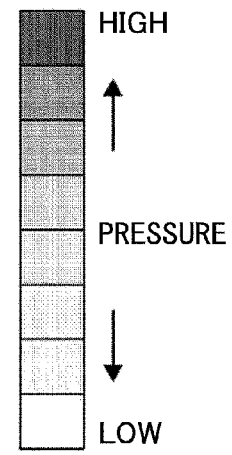

FILM DEPOSITION APPARATUS, FILM DEPOSITION METHOD, AND COMPUTER-READABLE RECORDING MEDIUM

CROSS-REFERENCE TO RELATED APPLICATIONS

The present application is based on Japanese Patent Application Nos. 2011-107350 and 2011-198396 filed with the Japanese Patent Office on May 12, 2011 and Sep. 12, 2011, respectively, the entire contents of which are incorporated herein by reference.

BACKGROUND OF THE INVENTION

1. Field of the Invention

The present invention generally relates to a film deposition apparatus, a film deposition method, and a computer-readable recording medium for forming plural layers of a reaction product on a surface of a substrate and performing plasma modification by sequentially supplying process gases that react to each other.

2. Description of the Related Art

As one method for depositing a thin film (e.g., silicon oxide film ($SiO_2$)) on a substrate such as a semiconductor wafer, there is an Atomic Layer Deposition (ALD) method. The ALD method forms plural layers of a reaction product by sequentially supplying plural types of process gases (reaction gases) to a surface of a wafer. For example, Japanese Laid-Open Patent Publication No. 2010-239102 discloses a known film deposition apparatus that performs a film deposition process using the ALD method. The known apparatus has plural wafers arranged on a rotation table inside a vacuum chamber in a circumferential direction of the rotation table and has the rotation table rotated relative to plural gas supplying parts arranged in a manner facing, for example, the rotation table. Thereby, the process gases can be sequentially supplied to the plural wafers.

The wafer heating temperature (film deposition temperature) of the ALD method is, for example, 300° C. The wafer heating temperature of the ALD method is low compared to that of an ordinary Chemical Vapor Deposition (CVD) method. This may cause organic materials contained in the process gases to enter the thin films as impurities. As described in Japanese Laid-Open Patent Publication No. 2011-40574, by performing modification using plasma together with thin film deposition, such impurities can be reduced or removed from the thin films.

However, in a case of performing modification with a plasma process apparatus that is separate from the above-described film deposition apparatus, there is a loss of time due to conveying of wafers between the plasma process apparatus and the film deposition apparatus. This may lead to decrease of throughput. Meanwhile, in a case of a film deposition apparatus combined with a plasma source for generating plasma, a modification process may be performed concurrently with or after performing a film deposition process. In this case, the plasma may electrically damage a wiring structure formed inside the wafer. In order to reduce the damage caused by the plasma, the plasma source may be separated away from the wafer. However, by separating the plasma source away from the wafer, the active species (e.g., ions, radicals) inside the plasma may be deactivated due to pressure conditions for performing a film deposition process. Thus, it is difficult to perform a satisfactory modification process due to the active species being unable to reach the wafer.

Although U.S. Pat. No. 7,153,542, Japanese Registered Patent No. 3144664, and U.S. Pat. No. 6,869,641 describe film deposition apparatuses using the ALD method, resolving such difficulties is not taught in U.S. Pat. No. 7,153,542, Japanese Registered Patent No. 3144664, and U.S. Pat. No. 6,869,641.

SUMMARY OF THE INVENTION

The present invention may provide a film deposition apparatus, a film deposition method, and a computer-readable recording medium that substantially obviate one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a film deposition apparatus, a film deposition method, and a computer-readable recording medium particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a film deposition apparatus includes a vacuum chamber into which first and second process gases are sequentially supplied for a plural number of times; a rotation table that includes a first surface having a substrate receiving area and configured to rotate the substrate receiving area inside the vacuum chamber; a first process gas supply part that supplies the first process gas to a first process region; a second process gas supply part that supplies the second process gas to a second process region separated from the first process region in a peripheral direction of the rotation table via a separation region; a plasma generation gas supply part that supplies a plasma generation gas into a plasma region inside the vacuum chamber; an antenna that faces the first surface of the rotation table and is configured to generate plasma from the plasma generation gas inside a plasma space by inductive coupling; and a faraday shield that is grounded and provided between the antenna and the plasma space, the faraday shield including a plurality of slits aligned in a direction perpendicularly intersecting the antenna.

Other objects and further features of the present invention will be apparent from the following detailed description when read in conjunction with the accompanying drawings.

BRIEF DESCRIPTION OF THE DRAWINGS

FIGS. 27-40 are schematic diagram illustrating experiment results obtained by a film deposition apparatus according to embodiments of the present invention.

DESCRIPTION OF THE PREFERRED EMBODIMENTS

In the following, embodiments of the present invention will be described with reference to the accompanying drawings.

Figure 1:
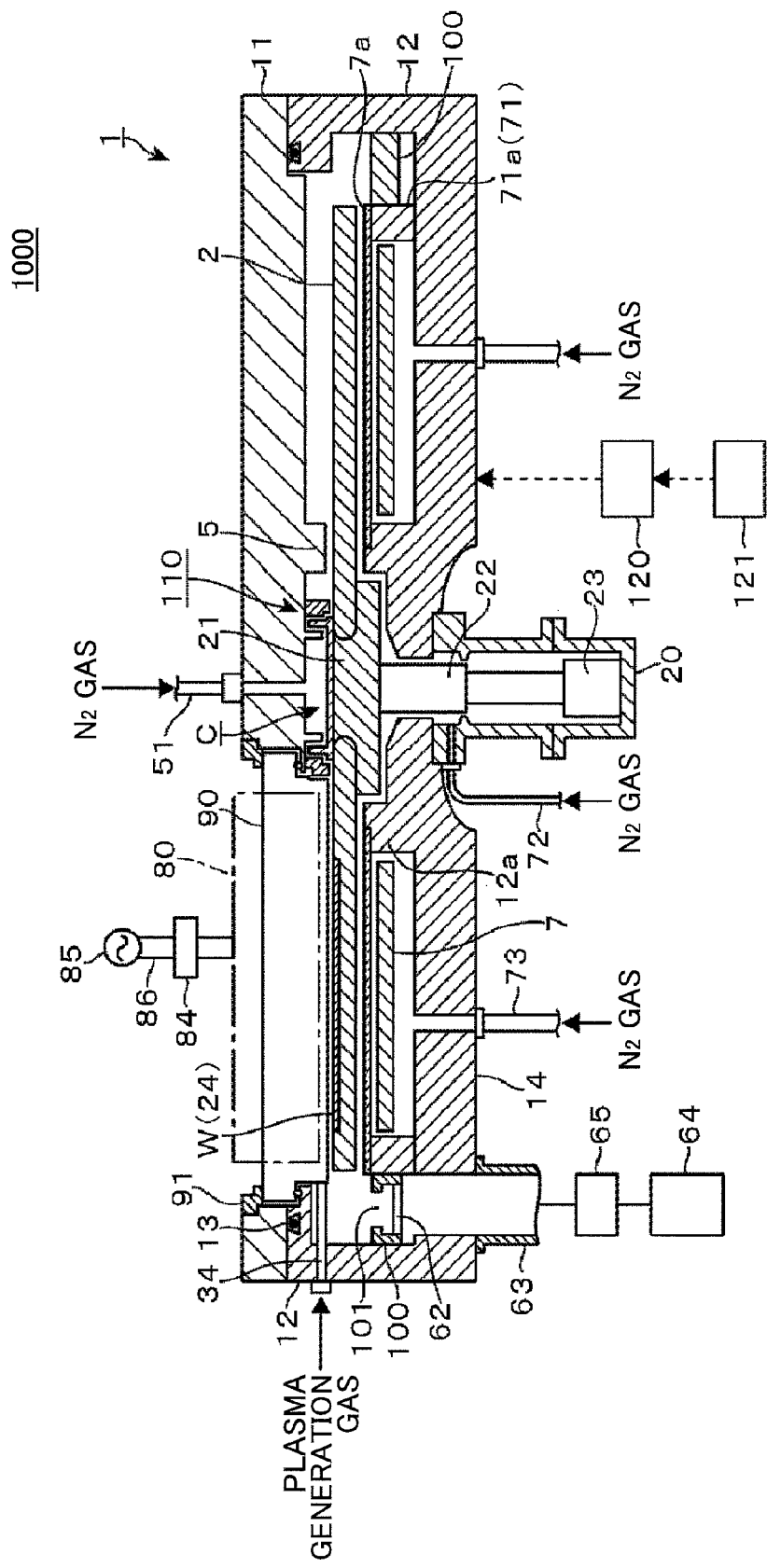
FIG. 1 is a vertical cross-sectional view of a film deposition apparatus according to an embodiment of the present invention.
Figure 2:
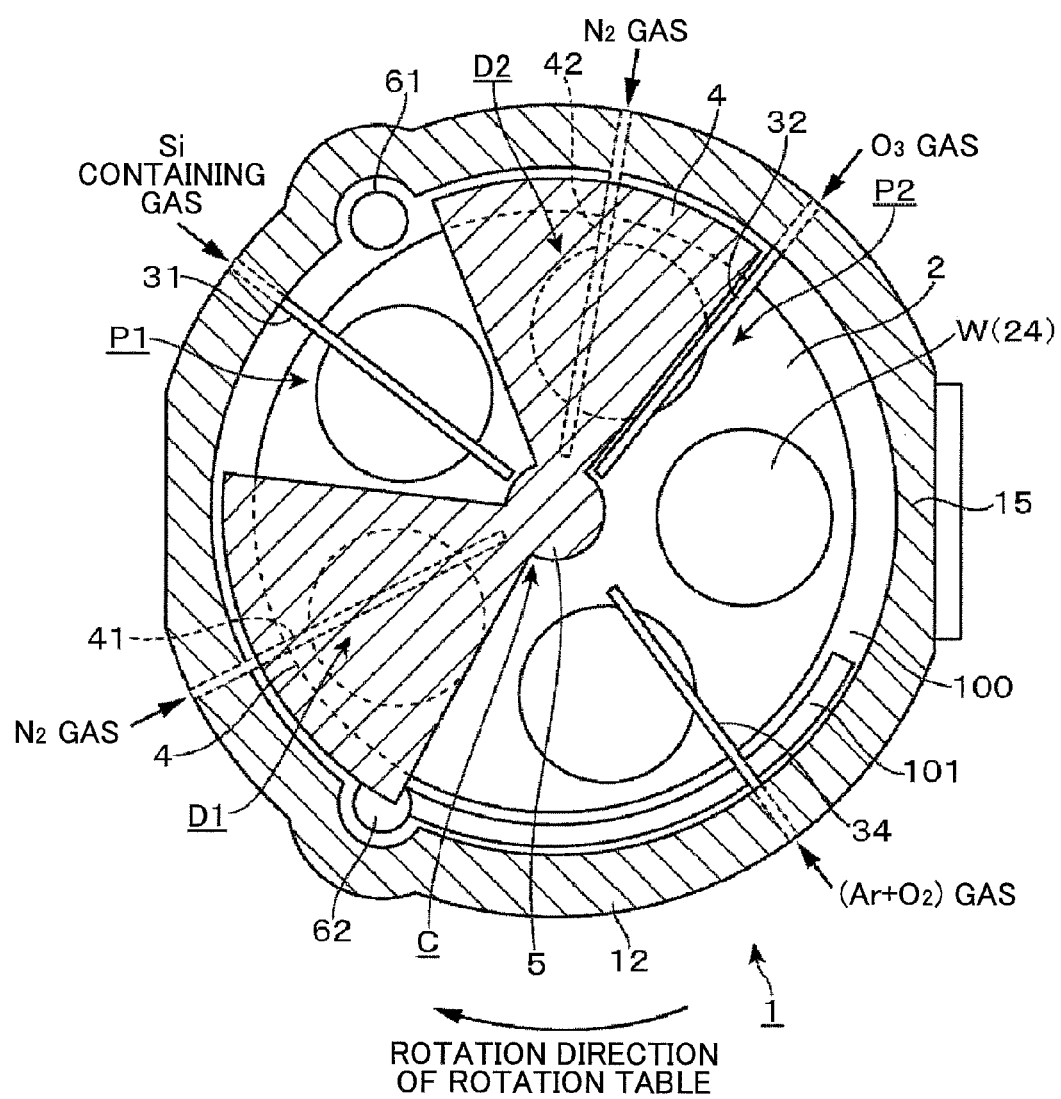
FIGS. 2 and 3 are horizontal cross-sectional views of a film deposition apparatus according to an embodiment of the present invention.

An example of a film deposition apparatus 1000 according to an embodiment of the present invention is described with reference to FIGS. 1 to 11. As illustrated in FIGS. 1 and 2, the film deposition apparatus 1000 includes a vacuum chamber 1 and a rotation table 2 provided inside the vacuum chamber 1. The plan shape of the vacuum chamber 1 is substantially a circle. The center of rotation of the rotation table 2 is located at the center of the vacuum chamber 1. As described in detail below, the film deposition apparatus 1000 deposits a thin film(s) by forming plural layers of a reaction product on a surface of a wafer W by using the ALD method and performs plasma modification on the thin film. In performing the plasma modification, the film deposition apparatus 1000 is configured to prevent the wafer W from being electrically damaged by plasma or to reduce the damage caused by the plasma. Next, parts of the film deposition apparatus 1000 are described in further detail.

The vacuum chamber 1 has a ceiling plate 11 and a chamber main body 12. The ceiling plate 11 is detachably attached to the chamber main body 12. A separation gas supply nozzle 51 for supplying separation gas (e.g., $N_2$ (nitrogen) gas) is connected to a center part of a top surface of the ceiling plate 11. The separation gas prevents different process gases from mixing with each other at a center area C inside the vacuum chamber 1. Reference numeral 13 in FIG. 1 represents an annular sealing member (e.g., O-ring) provided on a circumferential edge part of a top surface of the chamber main body 12.

The rotation table 2 is fixed to a center part of a core part 21 having a substantially circular cylinder shape. A rotation shaft 22 is attached to a bottom surface of the core part 21 and extends in a vertical direction of the vacuum chamber 1. The rotation table 2 is configured to be rotated around a vertical axis (in this embodiment, clockwise direction) by the rotation shaft 22. Reference numeral 23 of FIG. 1 represents a driving part that rotates the rotation shaft 22 around a vertical axis. Reference numeral 20 represents a case body in which the rotation shaft 22 and the driving part 23 are installed. The case body 20 has a flange part on a top surface of the case body 20. The flange part is hermetically attached to a bottom surface of a bottom surface part 14 of the vacuum chamber 1. A purge gas supply nozzle 72 for supplying purge gas (e.g., $N_2$ gas) to a bottom area of the rotation table 2 is connected to the case body 20. An annular projection part 12a is formed at an outer peripheral side of the core part 21 of the bottom surface part 14 of the vacuum chamber 1, in a manner that the projection part 12a is positioned in the vicinity of the bottom of the rotation table 2.

Figure 3:
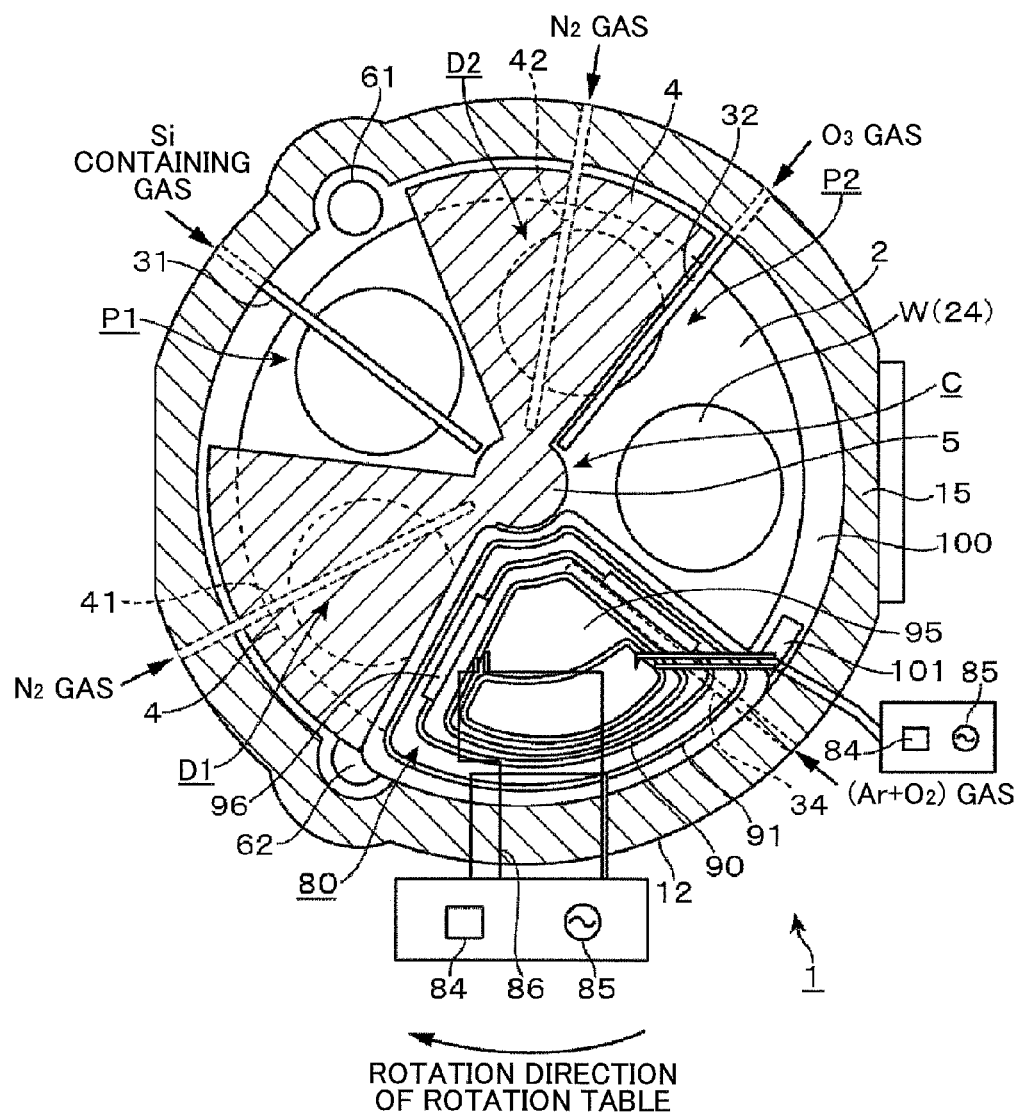

As illustrated in FIGS. 2 and 3, plural wafers W (in this embodiment, 5 wafers (substrates)) are placed on corresponding circular recess parts 24 (substrate receiving regions) on a surface part of the rotation table 2 in a rotation direction (circumferential direction) of the rotation table 2. The recess part 24 is set to have a diameter and a depth that allows an upper surface of the wafer W to match an upper surface of the rotation table (area on which no wafer W is placed) when the wafer W is placed (installed) into the recess part 24. The wafer W may have a diameter of, for example, 300 mm. The recess part 24 has through-holes (not illustrated) formed at a bottom surface thereof. The through-holes are for allowing, for example, 3 elevation pins, to penetrate therethrough and raise/lower the wafer W from its bottom side.

As shown in FIGS. 2 and 3, five nozzles 31, 32, 34, 41, 42 (formed of, for example, quartz) are provided at angular intervals along the circumferential direction of the vacuum chamber 1 (rotation direction of the rotation table 2) at positions facing the passing areas of the recess parts 24 of the rotation table 2. The nozzles 31, 32, 41, 42 are attached in a manner horizontally extending in a direction from the circumferential wall of the vacuum chamber 1 to the center area C of the vacuum chamber 1. In this example, the nozzles 31, 32, 34, 41, and 42 correspond to a first process gas nozzle 31, a second process gas nozzle, a plasma generation gas nozzle, a first separation nozzle, and a second separation nozzle, respectively. In the illustrated example, the plasma generation gas nozzle 34, the first separation gas nozzle 41, the first process gas nozzle, the second separation gas nozzle 42, and the second process gas nozzle 32 are arranged in this order along a clockwise direction from a transfer opening 15 (described below).

As illustrated in FIG. 1, a plasma generation part 80 is provided at an upper side of the plasma gas generation nozzle 34. The plasma generation part 80 is for forming gas into plasma. The plasma generation part 80 is described in further detail below.

The first and second process gas nozzles 31, 32 are also referred to as a first process gas supply part, and a second process gas supply part, respectively. The first and second separation gas nozzles are also referred to as a first separation gas supply part and a second separation gas supply part, respectively. It is to be noted that FIG. 2 illustrates a state where the plasma generation part 80 and the below-describing housing 90 are removed for the mere purpose of making the plasma generation gas nozzle 34 visible. FIG. 3 illustrates a state where the plasma generation part 80 and the housing 90 are attached. Further, the plasma generation part 80 in FIG. 1 is schematically illustrated with a dash-dot line.

Each of the nozzles 31, 32, 34, 41, 42 is connected to a corresponding gas supply source (not illustrated) via a flow rate adjustment valve. That is, the first process gas nozzle 31 is connected to a gas supply source that supplies a first process gas containing silicon (Si). For example, the first process gas may be BTBAS (bis(tertiary-butylamino) silane, $SiH_2$ (NH—$C(CH_3)_3)_2$) gas. The second process gas nozzle 32 is connected to a gas supply source that supplies, for example, a mixed gas of ozone ($O_3$) gas and oxygen ($O_2$) gas. The plasma generation gas nozzle 34 is connected to a gas supply source that supplies, for example, a mixed gas of argon (Ar) gas and $O_2$ gas (volume ratio being approximately Ar:$O_2$=100:0.5 to 100:20). The first and second separation gas nozzles 41, 42 are connected to a gas supply source that supplies nitrogen ($N_2$) gas, respectively. In the following, the second process gas is described as $O_3$ gas for the sake of convenience. Further, although an ozonizer is provided in the second process gas nozzle 32 for generating $O_3$ gas, the ozonizer is not illustrated.

Gas ejection holes 32 are formed in plural parts of the gas nozzles 31, 32, 34, 41, and 42 in the radial direction of the rotation table 2. The gas ejection holes 32 may be formed at equal intervals in the gas nozzles 31, 32, 34, 41, and 42. The gas ejection holes 32 formed in the gas nozzles 31, 32, 41, and 42 may be provided on the bottom surface of the gas nozzles 31, 32, 41, and 42. The gas ejection holes 32 formed in the gas nozzle 34 (i.e. plasma generation gas nozzle) may be provided on the side surface of the plasma generation gas nozzle 34. The ejection holes 32 of the plasma generation gas nozzle 34 face an upstream side relative to the rotation direction of the rotation table 2 (i.e. toward the second process gas nozzle 32) but at the same time downward (diagonally downward). The reason that the ejection holes 32 of the plasma generation gas nozzle 34 face the aforementioned direction is described below. The ejection holes 32 of the plasma generation gas nozzle 34, which are formed along a longitudinal direction of the plasma generation gas nozzle 34, have a diameter of, for example, 0.3 mm to 0.5 mm. The distance between the gas ejection holes of the nozzles 31, 32, 34, 41, and 42 and the top surface of the rotation table 2 is, for example, approximately 1 to 5 mm.

The area below the first process gas nozzle 31 is a first process area P1 at which a gas containing Si is adsorbed to the wafer W. The area below the second process gas nozzle 32 is a second process area P2 at which a reaction is created between the Si containing gas adsorbed to the wafer W and an $O_3$ gas. The first separation gas nozzle 41 is for separating the first process area P1 from the second process area P2, to thereby form a first separation area D1. The second separation gas nozzle 42 is for separating the second process area P2 from the first process area P1, to thereby form a second separation area D2. In each of the first and second separation areas D1, D2, a sector-shaped convex portion 4 is provided in the ceiling plate 11 of the vacuum chamber 1, as shown in FIGS. 2-3. The first and second separation gas nozzles 41, 42 are accommodated inside corresponding grooves 43 formed in the convex portions 4. In order to prevent the first and second process gases from mixing with each other, the convex portions 4 have low flat ceiling faces (first ceiling faces) 44 being provided on both sides of each of the first and second separation gas nozzles 41, 42 in the outer peripheral direction, and ceiling faces (second ceiling faces) 45 higher than the ceiling faces 44 being provided on both sides of the ceiling faces 44 in the outer peripheral direction of the ceiling faces 44 (see, for example, FIG. 7). The convex portion 4 has a bent portion that bends in an L-shape at the outer circumferential edge of the convex portion 4 (portion of the outer edge of the vacuum chamber 1). The bent portion is provided in a manner facing the outer edge surface of the rotation table 2 and having a slight gap between the chamber main body 12 and the bent portion, so that the first and second process gases can be prevented from mixing with each other.

Figure 4:
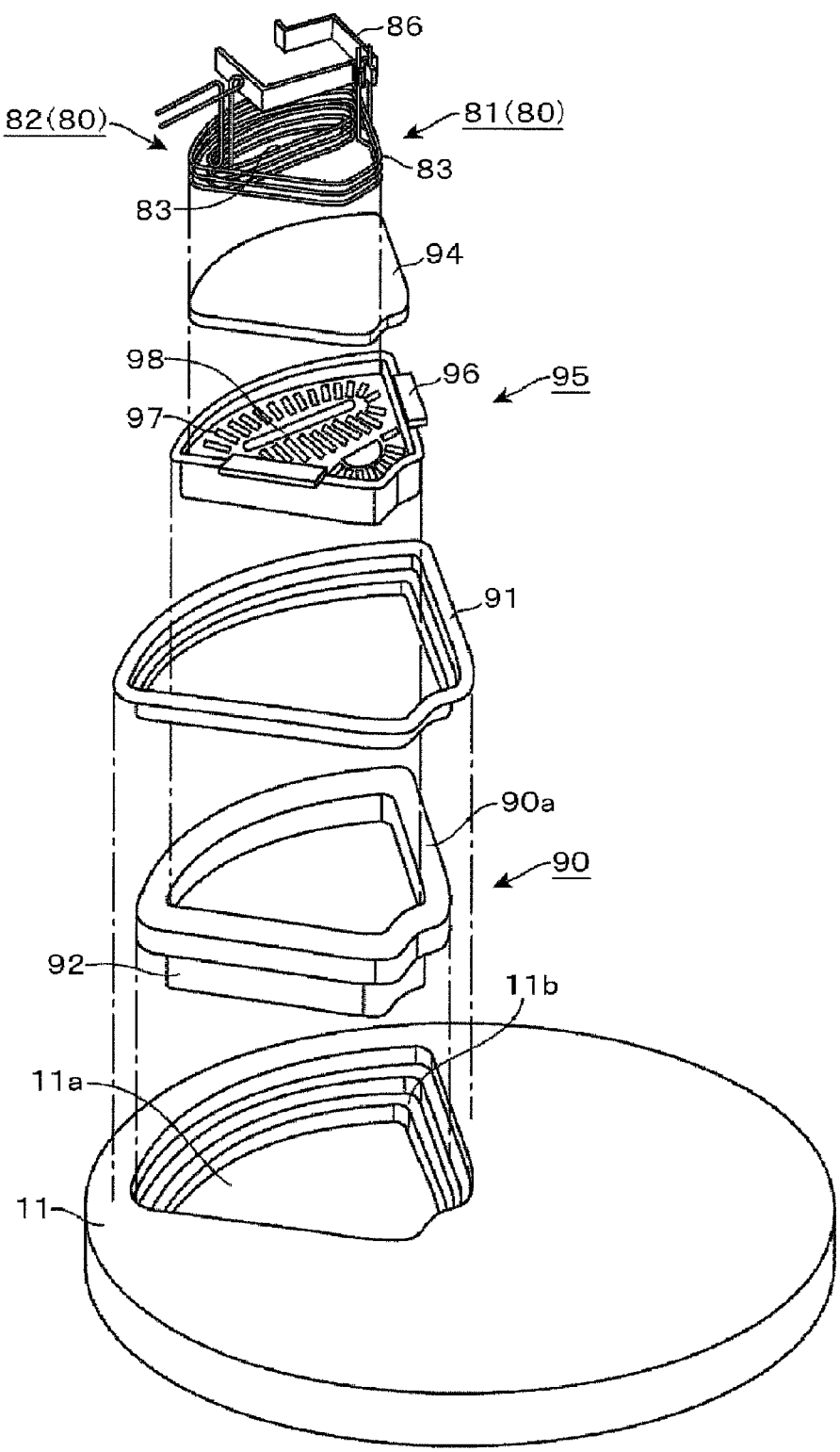
FIG. 4 is an exploded perspective view illustrating a part of the inside of a film deposition apparatus according to an embodiment of the present invention.

Next, the plasma generation part 80 is described in further detail. For example, the plasma generation part 80 is formed by winding an antenna 83 in a coil. For example, the antenna 83 may be a metal wire formed of copper (Cu). The plasma generation part 80 is provided above the ceiling plate 11 of the vacuum chamber 1 in a manner that the inner area of the vacuum chamber 1 is hermetically sealed (air-tight). In this embodiment, the antenna 83 is made of a material formed by applying a nickel plating and a metal plating on a copper surface in this order. For example, as illustrated in FIG. 4, an opening part 11a is formed in the ceiling plate 11 toward the upper side of the plasma generation gas nozzle 34 (more specifically, formed in an area beginning from a position slightly upstream of the plasma generation gas nozzle 34 relative to the rotation direction of the rotation table 2 to a position slightly upstream of the first separation area D1 (located downstream of the plasma generation gas nozzle 34). The opening part 11a has an opening in which the opening is a sector-shape from a plane view.

Figure 5:
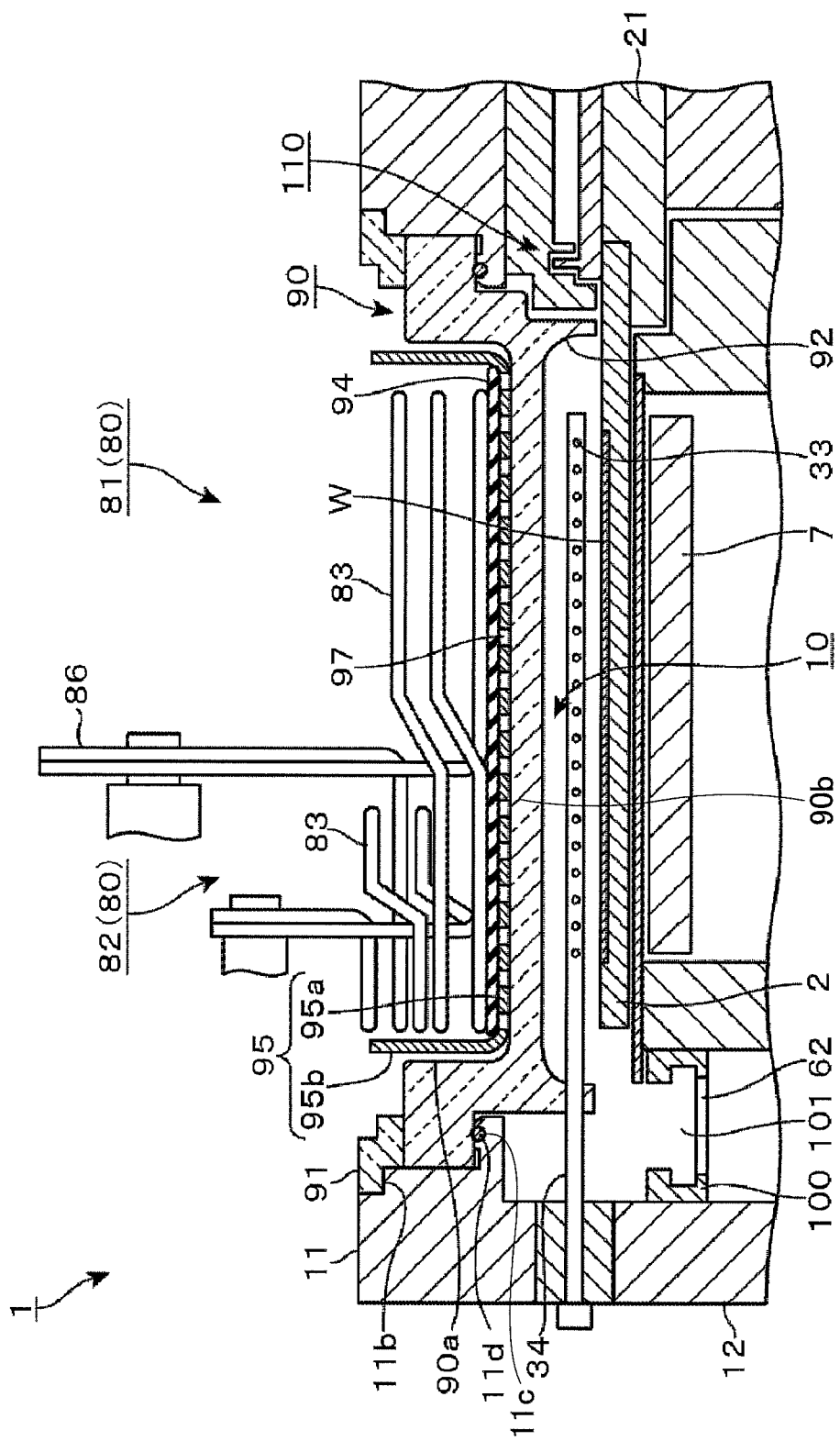
FIG. 5 is a vertical cross-sectional view illustrating a part of the inside of a film deposition apparatus according to an embodiment of the present invention.

For example, the opening part 11a is formed starting from a position separated approximately 60 mm from the rotation center of the rotation table 2 to a position separated approximately 80 mm outward from the outer edge of the rotation table 2. The opening part 11a has an end (toward the center of the rotation table 2) having an arcuate recess shape from a plan view. The recess of the end of the opening part 11a is formed along the outer rim of the labyrinth structure part 110 in a manner avoiding (not interfering with) the labyrinth structure part 110. As illustrated in FIGS. 4 and 5, the opening diameter of the opening part 11a becomes gradually smaller from the top end of the ceiling plate 11 to the bottom end of the ceiling plate 11. The opening part 11a may be formed having, for example, 3 steps 11b throughout the periphery of the opening part 11a. A groove 11c is formed on a top surface of the lowermost step (opening rim part) of the three steps 11b throughout the entire periphery of the opening part 11a as illustrated in FIG. 5. A sealing member (in this embodiment, an O-ring) 11d is provided inside the groove 11c. It is, however, to be noted that the groove 11c and the O-ring 11d are not illustrated in FIG. 4.

Figure 6:
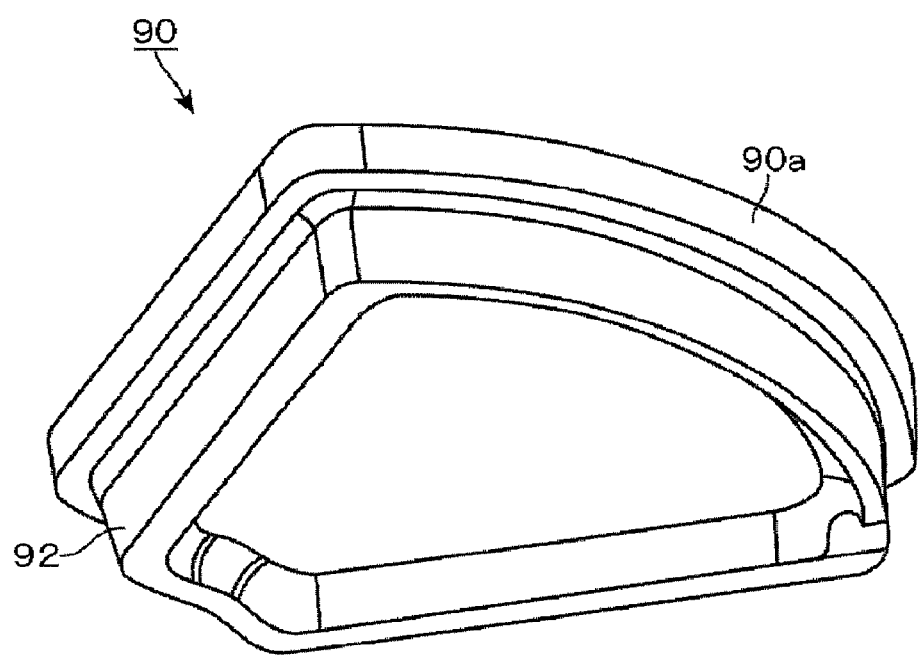
FIG. 6 is a perspective view illustrating a part of the inside of a film deposition apparatus according to an embodiment of the present invention.

As illustrated in FIGS. 4, 5, and 6, the housing 90 is provided in the opening 11a. The housing 90 has a flange part 90a constituting an upper peripheral rim part of the housing 90 and a recess part 90b constituting a lower middle part of the housing 90. The flange part 90a is formed extending horizontally in a flange-like manner throughout the upper periphery of the housing 90. The recess part 90b is recessed toward the inside of the vacuum chamber 1. The housing 90 is formed of a magnetic permeable material (a material capable of allowing magnetic force to permeate therethrough) including a dielectric material (e.g., quartz). As illustrated in FIG. 9, the thickness of the recess part 90b has a thickness t of, for example, 20 mm. In a case where the wafer W is positioned below the housing 90, the distance between an inner wall surface (toward the center area C) of the housing 90 and the outer rim of the wafer W is 70 mm. Accordingly, an angle α defined by two sides of the opening part 11a (one side toward the upstream side of the rotation direction of the rotation table 2 the other side toward the downstream side of the rotation direction of the rotation table 2) and a rotation center of the rotation table 2 is, for example, 68 degrees (see, for example, FIG. 8).

When the housing 90 is placed inside the opening part 11a, the flange part 90a engages the lowermost step part 11b. Then, the step part 11b (ceiling plate 11) and the housing 90 are joined together by the O-ring 11d. Thereby, the step part 11b (ceiling plate 11) and the housing 90 become hermetically sealed (airtight). Further, the internal atmosphere of the vacuum chamber 1 becomes airtight by pressing a pressing member 91 downward to the flange part 90a (so that pressure is exerted throughout the periphery of the opening part 11a) and fastening the pressing member 91 to the ceiling plate 11 with, for example, a bolt (not illustrated). The pressure member 91 is a frame having a shape matching the outer rim of the opening part 11a. When the housing 90 is hermetically fastened to the ceiling plate 11, the distance h between the bottom surface of the housing 90 and the top surface of the wafer W mounted on the rotation table 2 is 4 mm to 60 mm (in this embodiment, 30 mm). It is to be noted that FIG. 6 is a bottom view of the housing 90 according to an embodiment of the present invention.

As illustrated in, for example, FIG. 1 and FIGS. 5-7, a gas control projecting part (hereinafter also simply referred to as "projecting part") 92 is formed at a bottom outer rim part of the housing 90 for preventing $N_2$ gas or $O_3$ gas from entering an area below the housing 90. The projecting part 92 is formed throughout the periphery of the housing 90 and projects orthogonally to the rotation table 2 located below the housing 90. The plasma generation gas nozzle 34 is installed in an area surrounded by the inner peripheral surface of the projecting part 92, the bottom surface of the housing 90, and the top surface of the rotation table 2.

Plasma is generated from the gas supplied from the plasma generation gas nozzle 34 in the area below the housing 90 (plasma space 10). Accordingly, if $N_2$ gas enters the area below the housing 90, $NO_x$ gas would be generated by a reaction caused between plasma of N2 gas and plasma of $O_3$ ($O_2$) gas. The generated $NO_x$ gas causes corrosion of the parts and components of the vacuum chamber 1. Therefore, in order to prevent $NO_2$ gas from entering the area below the housing 90, the projecting part 92 is formed on the bottom side of the housing 90.

Figure 7:
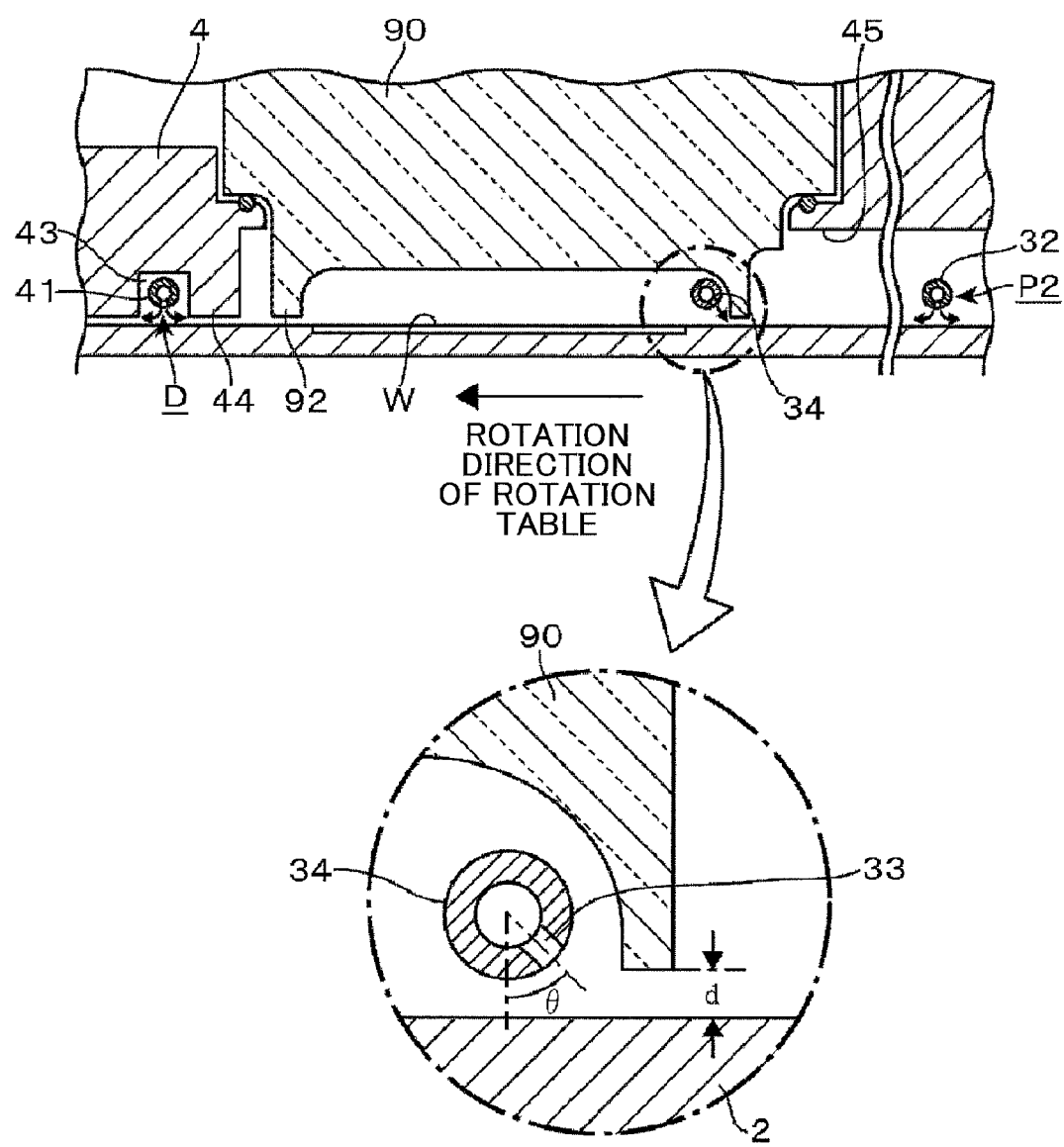
FIG. 7 is a vertical cross-sectional view illustrating a part of the inside of a film deposition apparatus according to an embodiment of the present invention.

As illustrated in FIG. 7, a part of the projecting part 92 toward a base end of the plasma generation gas nozzle 34 (i.e. toward a sidewall of the vacuum chamber 1) has an arcuate notch matching the outer shape of the plasma generation gas nozzle 34. the distance d between the bottom surface of the projecting part 92 and the top surface of the rotation table 2 is 0.5 mm to 4 mm (in this embodiment, 2 mm). The width of the projecting part 92 is, for example, 10 mm. The height of the projecting part 92 is, for example, 28 mm. It is to be noted that FIG. 7 is a vertical cross-sectional view of the vacuum chamber 7 with respect to the rotation direction of the rotation table 2.

In this embodiment, the rotation table 2 rotates in a clockwise direction during a film deposition process. The rotation of the rotation table 2 causes $N_2$ gas to flow to the bottom of the housing 90 from the space between the rotation table 2 and the projecting part 92. Therefore, gas is ejected from the bottom of the housing to the space between the rotation table 2 and the projecting part 92 in order to prevent $N_2$ gas from entering the bottom of the housing 90 from the space between the rotation table 2 and the projecting part 92. More specifically, as illustrated in, for example, FIG. 7, a the plasma generation gas nozzle 34 has an gas ejection hole 33 facing toward the space between the rotation table 2 and the projecting part 92. That is, the plasma generation gas nozzle 34 is positioned so that the gas ejection hole 33 is oriented downward and toward an upstream side of the rotation direction of the rotation table 2. As illustrated in FIG. 7, the orientation of the gas ejection hole 33 of the plasma generation gas nozzle 34 relative to a vertical direction is, for example, approximately 45 degrees.

As described above, the O-ring 11d hermetically seals off the space between the ceiling plate 11 and the housing 90 from the bottom area of the housing 90 (plasma space 10). As illustrated in FIG. 5, the projecting part 92 is formed throughout the periphery of the housing 90 between the plasma space 10 and the O-ring 11d. In order to prevent plasma from directly contacting the O-ring 11d, the O-ring 11d is positioned away from the plasma space 10. Thus, even in a case where plasma generated in the plasma space 10 spreads toward the O-ring 11d, the plasma is prevented from reaching the O-ring 11d because the plasma would have to pass below the projecting part 92 in order to reach the O-ring 11d but would nevertheless become inactive before reaching the O-ring 11d.

As illustrated in FIGS. 4 and 5, a grounded faraday shield 95 is installed inside the housing 90. The faraday shield 95 is formed of a conductive metal plate having a thickness k of approximately 1 mm. The faraday shield 95 is formed into a shape matching an inner shape of the housing 90. In this embodiment, the faraday shield 95 is formed of a copper plate or a copper plate having its bottom side plated with a nickel (Ni) film or a gold (Au) film. The faraday shield 95 includes a horizontal plane 95a and a vertical plane 95b. The horizontal plane 95a is formed extending horizontally along the bottom surface of the housing 90. The vertical plane 95b is formed upright from an outer peripheral rim of the horizontal plane 95a throughout the periphery of the faraday shield 95. The faraday shield 95 has a substantially sector shape from a plan view. The faraday shield 95 may be formed by performing a rolling process on a metal plate. Alternatively, the faraday shield 95 may be formed by bending a part of a metal plate corresponding to the outer side of the horizontal plane 95a.

As illustrated in FIGS. 4 and 5, support parts 96 are provided extending horizontally from an upper rim of the faraday shield 95. When viewing the faraday shield 95 from the rotation center of the rotation table 2, the support parts 96 are positioned on the left and right sides of the faraday shield 95. When the faraday shield 95 is installed in the housing 90, the bottom surface of the faraday shield 95 contacts the top surface of the housing 90, and the flange part 90a of the housing 90 supports the support parts 96. An insulation plate 94 is placed on the horizontal plane 95a for insulating the faraday shield 95 from the plasma generation part 80 mounted above the faraday shield 95. The insulation plate 94 is formed of, for example, quartz. The insulation plate 94 may have a thickness of approximately 2 mm. Plural slits 97 are formed in the horizontal plane 95a. The shape of the slits and/or the arrangement slits are described below together with the description of the antenna 83 of the plasma generation part 80. It is to be noted that the insulation plate 94 is not illustrated in below-described FIGS. 8 and 9.

The plasma generation part 80 is installed inside the faraday shield 95. Accordingly, as illustrated in FIGS. 4 and 5, the plasma generation part 80 is provided facing the inside of the vacuum chamber 1 (wafer W on the rotation table 2) via the housing 90, the faraday shield 95, and the insulation plate 94. The antenna 83 of the plasma generation part 80 is wound around a vertical axis. In this embodiment, two plasma generation parts 80 are provided in the faraday shield 95. Thus, in this embodiment, the two plasma generation parts 80 may also be indicated as a first plasma generation part 81 and a second plasma generation part 82. Each of the first and second plasma generation parts 81, 82 is wound 3 times. As illustrated in FIGS. 4 and 5, the first plasma generation part 81 has a substantially sector shape matching the inner rim of the housing 90. An end part of the first plasma generation part 81 toward the center area C and an end part of the first plasma generation part 81 toward the outer periphery of the rotation table 2 are positioned closely to the inner wall of the housing 90, so that plasma can be radiated (supplied) throughout the area between the end part of the first plasma generation part 81 toward the center area C and the end part of the first plasma generation part 81 toward the outer periphery of the rotation table 2. Although a flow path is provided inside the antenna 83 for allowing cooling water to flow therethrough, the flow path is not illustrated in the drawings.

The second plasma generation part 82 is for supplying plasma to the wafer W in an outer peripheral area in a radial direction of the rotation table 2. The second plasma generation part 82 is located in an area between a position separated 200 mm from the center of the wafer W mounted on the rotation table 2 in an outer peripheral direction of the rotation table 2 and a position separated 90 mm from the outer rim of the rotation table 2. When the rotation table 2 is rotated, the circumferential speed is faster at the outer peripheral area of the rotation table 2 than at the center area of the rotation table 2. Therefore, the amount of plasma supplied to the wafer W may be less at the outer peripheral area of the rotation table 2 than at the center area of the rotation table 2. Thus, the second plasma generation part 82 is for equalizing the amount of plasma supplied to the wafer W in the radial direction of the rotation table 2. That is, the second plasma generation part 82 is for compensating the amount of plasma supplied from the first plasma generation part 81 to the wafer W.

The antenna 83 of each of the first and the second plasma generation parts 81, 82 is connected to a high frequency power source 85 via a matching circuit 84 (see, for example, FIG. 3). The frequency of the high frequency power source 85 is, for example, 13.56 MHz. The output voltage of the high frequency power source 85 is, for example, 5000 W. Thereby, the high frequency electric power supplied to each of the first and the second plasma generation parts 81, 82 can be adjusted. The illustrations of the matching circuit 84 and the high frequency power source 85 are simplified in, for example, FIG. 3. Reference numeral 86 in FIGS. 1, 3, and 4 indicates a connection electrode for electrically connecting each of the first and the second plasma generation parts 81, 82 to the matching circuit 84 and the high frequency power source 85.

Next, the slits 97 of the faraday shield 95 are described in detail. Among the elements of the electric field and the magnetic field (electromagnetic field) generated by the first and the second plasma generation part 81, 82, the slits 97 prevent the elements of electric field from traveling toward the bottom of the wafer W while allowing the elements of the magnetic field to reach the wafer W. If the electric field generated by the first and the second plasma generation part 81, 82 reaches the wafer W, the electrical wiring inside the wafer W may be electrically damaged by the electric field. Because the faraday shield 95 is formed of a grounded metal plate, not only is the electric field prevented from reaching the wafer W but also the magnetic field is prevented from reaching the wafer W unless the slits 97 are formed in the faraday shield 95. That is, in a case where a large opening part is formed below the antenna 83, not only the electric field but also the magnetic field pass through the opening. Accordingly, the slits 97 are formed with a size (measurements) and arranged in a manner described below for blocking the electric field while allowing the magnetic field to pass therethrough.

Figure 8:
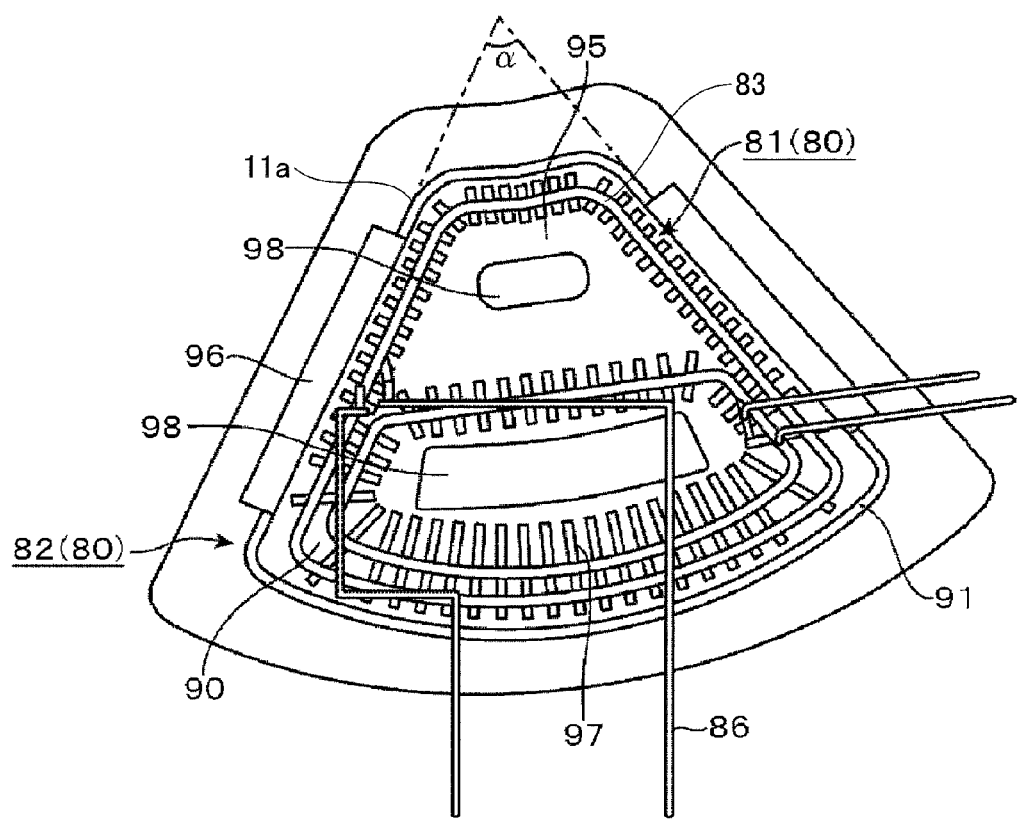
FIG. 8 is a plan view illustrating a part of the inside of a film deposition apparatus according to an embodiment of the present invention.
Figure 9:
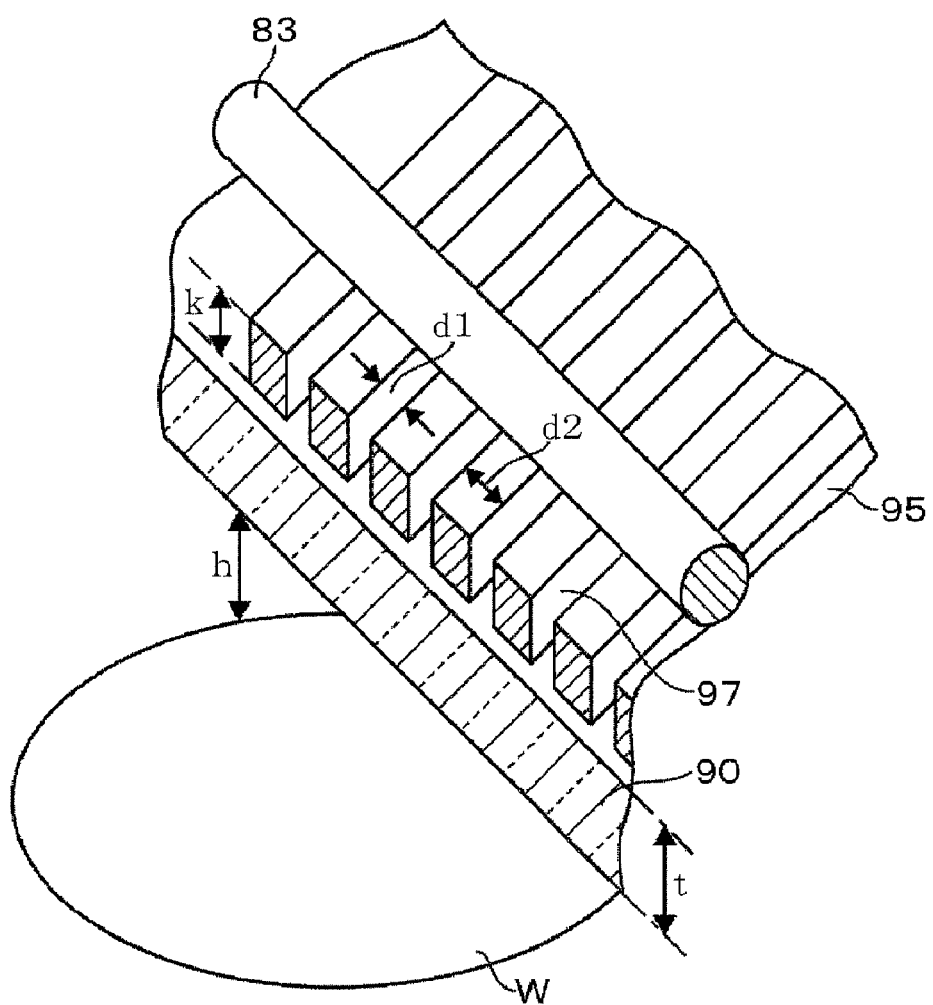
FIG. 9 is a perspective view illustrating a part of a faraday shield of a film deposition apparatus according to an embodiment of the present invention.

As illustrated in FIG. 8, the slits 97 are formed perpendicularly intersecting the winding direction of the antenna 83 of the first and the second plasma generation parts 81, 82. The slits 97 are formed below the antenna 83 of the first and the second plasma generation parts 81, 82 and arranged along the peripheral direction of the antenna 83 of the first and the second plasma generation parts 81, 82. Accordingly, a portion of the slits 97 (provided in a first area in which the antenna 83 is formed along the radial direction of the rotation table 2) are arranged in a straight-line or an arc along a tangential direction of the rotation table 2 or the circumferential direction of the rotation table 2. A portion of the slits 97 (provided in a second area in which the antenna 83 is formed in an arcuate manner along the outer rim of the rotation table 2) are arranged in a straight-line and oriented in a direction extending from the rotation center of the rotation table 2 to the outer rim of the rotation table 2. A portion of the slits 97 (provided in a third area between the first and second areas at which the antenna 83 bends) are oblique to the peripheral direction of the rotation table 2 and the radial direction of the rotation table 2, so that the slits 97 perpendicularly intersect the antenna 83 at the bend part of the antenna 83. Accordingly, as illustrated in FIGS. 8 and 9, many slits 97 are arranged along the extending direction of the antenna 83 as illustrated in FIGS. 8 and 9.

The high frequency power source 85 (having a frequency of 13.56 MHz in this embodiment) is connected to the antenna 83. The wavelength corresponding to the frequency of the high frequency power source 85 is 22 m according to this embodiment. Accordingly, the slits 97 are formed so that the width d1 of each slit 97 is approximately 1/10000 or less than the wavelength of the antenna 83. As illustrated in FIG. 9, the width of the slits d1 ranges from 1 mm to 5 mm (in this embodiment, 2 mm), and the distance d2 between adjacent slits 97 ranges from 1 mm to 5 mm (in this embodiment, 2 mm). When viewed from the direction in which the antenna 83 extends, each of the slits 97 is formed having a length of 60 mm as illustrated in FIG. 9. The slits 97 are formed in an area of the faraday shield 95 that starts from a position approximately 30 mm to the right from a right end of the antenna 83 to a position approximately 30 mm to the left from a left end of the antenna 83. In a center area of the faraday shield 95, an opening part 98 is formed toward the rotation center of the rotation table 2 and another opening part 98 is formed toward the outer periphery of the rotation table 2. It is to be noted that the slits 97 are not illustrated in FIG. 3. Further, although the illustration of the slits 97 are simplified in FIGS. 4 and 5, approximately 150 slits may be formed in the faraday shield 95. Further, although the width d1 of the slits 97 increases the farther away from the opening part 98, the drawings such as FIGS. 4, 8, and 9 do not illustrate the increasing width of the slits 97.

Next, parts and components of the vacuum chamber 1 according to an embodiment of the present invention are described. As illustrated in FIGS. 1, 2, 5, and 10, a side ring (cover body) 100 is provided slightly below the rotation table 2 at the outer peripheral side of the rotation table 2. In a case where a fluorine type cleaning gas is supplied instead of process gas for cleaning the film deposition apparatus 1000, the side ring 100 protects the inner wall of the vacuum chamber 1 from the cleaning gas. That is, without the side ring 100, an airstream (evacuation airstream) would flow in a horizontal direction through an annular concave airstream path formed between an outer peripheral part of the rotation table 2 and the inner wall of the vacuum chamber 1. Accordingly, the side ring 100 is placed in the airstream path, so that the inner wall of the vacuum chamber 1 is prevented from being exposed to the airstream path as much as possible. In this embodiment, the first and the second separation areas D1, D2, the outer rim of the housing 90 are exposed above the side ring 100.

A first evacuation port 61 and a second evacuation port 62 are formed at an upper surface of the side ring 100. As illustrated in FIG. 2, the first and the second evacuation ports 61, 62 are separated from each other in a peripheral direction of the rotation table 2. That is, the first and the second evacuation ports 61, 62 are formed in correspondence with evacuation ports (not illustrated) provided below the airstream path. The first evacuation port 61 is positioned slightly toward the second separation area D2 in an area substantially between the first process gas nozzle 31 and the second separation area D2 located downstream of the first process gas nozzle 31 with respect to the rotation direction of the rotation table 2. The second evacuation port 62 is positioned slightly toward the first separation area D1 in an area substantially between the plasma generation gas nozzle 34 and the first separation area D1 located downstream of the plasma generation gas nozzle 34 with respect to the rotation direction of the rotation table 2. The first evacuation port 61 is for evacuating the first process gas and the separation gas. The second evacuation port 62 is for evacuating the second process gas, the separation gas, and the plasma generation gas. The first and the second evacuation ports are connected to an evacuation mechanism such as a vacuum pump 64 via an evacuation pipe 63 of a pressure adjustment valve 65 such as a butterfly valve.

Figure 10:
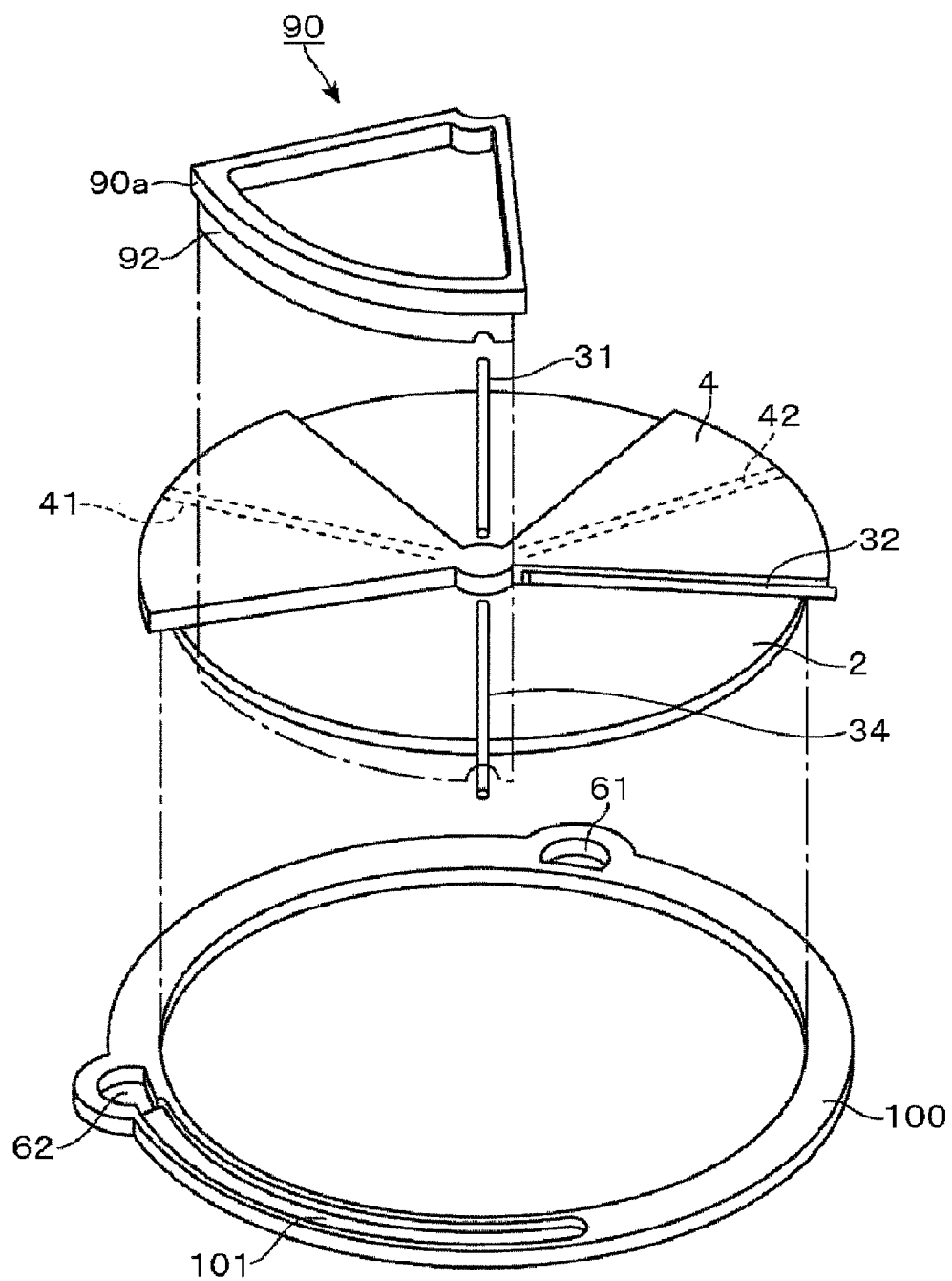
FIG. 10 is an exploded perspective view illustrating a side ring of a film deposition apparatus according to an embodiment of the present invention.

Because the housing 90 is formed extending from the center area C of the vacuum chamber 1 to the outer rim of the vacuum chamber 1, the housing 90 restricts each gas (ejected from an area upstream of the housing 90 with respect to the rotation direction of the rotation table 2) flowing toward the second evacuation port 62. Accordingly, a groove-like gas flow path 101 is formed on an upper surface of the side ring 100 at the outer side of the housing 90. As illustrated in FIGS. 3 and 10, the gas flow path 101 is formed in an area starting from a position located approximately 60 mm toward the second process gas nozzle 32 from a rim part (toward the upstream side with respect to the rotation direction of the rotation table 2) of the housing 90 and ending at a position of the second evacuation port 62. The gas flow path 101 is formed having an arcuate shape with a thickness of, for example, 30 mm. Accordingly, the gas flow path 101 is formed along the outer rim of the housing 90 and span across the outer rim part of the housing 90 from a plan view. Although not illustrated in the drawings, the side ring 100 may be covered by a coating material such as alumina or by a quartz cover for attaining corrosion resistance against a fluorine type gas.

As illustrated in FIGS. 1 and 2, a projecting part 5 is formed at a center part of the bottom surface of the ceiling plate 11. The projecting part 5 continues from the convex portion 4 toward the center area C of the vacuum chamber 1. The projecting part 5 is formed throughout the periphery of the center area C of the vacuum chamber 1. The projecting part 5 has an annular shape. The height of the bottom surface of the projecting part 5 relative to the top surface of the rotation table 2 is substantially the same as the height of the bottom surface of the low flat ceiling face 44 of the convex portion 4 relative to the top surface of the rotation table 2 (see, for example, FIGS. 1 and 7). The labyrinth structure part 110 is provided above the core part 21 for preventing the first and the second process gases from mixing with each other at the center area C of the vacuum chamber 1. As illustrated in FIG. 1, the housing 90 is formed extending to the vicinity of the center area C of the vacuum chamber 1. Accordingly, the core part 21, which supports the center part of the rotation table 2, is formed in a position close to the rotation center of the rotation table 2 but away from the housing 90. Accordingly, it is easier for the process gases to mix with each other at the center area C of the vacuum chamber 1 than at the outer rim part of the vacuum chamber 1. Accordingly, the flow of the first and the second processes gases can be blocked by the labyrinth structure part 110 and prevent the first and the second process gases from mixing with each other.

Figure 11:
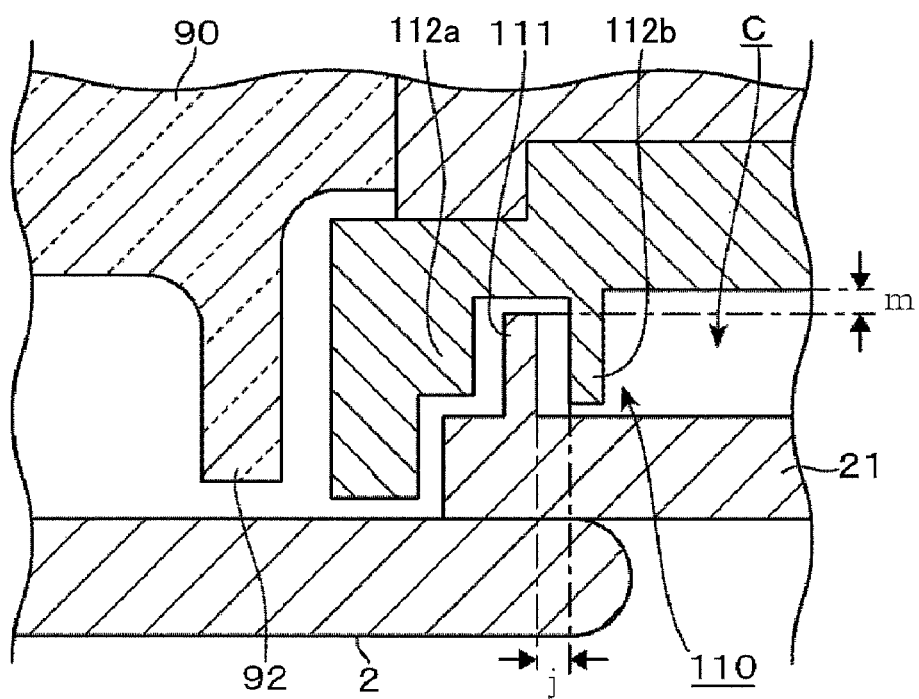
FIG. 11 is a vertical cross-sectional view illustrating a part of a labyrinth structure part of a film deposition apparatus according to an embodiment of the present invention.

FIG. 11 is an enlarged view of the labyrinth structure part 110 according to an embodiment of the present invention. As illustrated in FIG. 11, the labyrinth structure part 110 includes a first wall part 111 extending vertically from the rotation table 2 toward the ceiling plate 11, a second wall part 112a, and another second wall part 112b extending vertically from the ceiling plate 11 toward the rotation table 2. Each of the first and the second wall parts 111, 112a, 112b are formed in the peripheral direction. Further, the first wall part 111, the second wall part 112a, and the other second wall part 112b are alternately arranged in the radial direction of the rotation table 2. More specifically, the second wall part 112a, the first wall part 111, and the other second wall part 112b are arranged in this order from the side toward the projecting part 5 to the side toward the center area C. In this embodiment, the second wall part 112aa bulges more toward the side of the projecting part 5 than the first wall part 111 and the other second wall part 112b. For example, the distance j between the first wall part 111 and the second wall part 112a/112b is 1 mm. For example, the distance m between the first wall part 111 and the ceiling plate (also the distance between the second wall part 112a/112b and the core part 21) is 1 mm.

For example, owing to the labyrinth structure part 110, the first process gas flowing from the first process gas nozzle 31 toward the center area C needs to pass the first and the second wall parts 111, 112a, 112b in order to reach the center area C. Accordingly, the flow rate of the first process gas decreases as the first process gas advances toward the center area C. Thus, it becomes difficult for the first process gas to spread. As a result, the first process gas is forced back to the process area P1 by the separation gas supplied to the center area C before reaching the center area C. Likewise, it becomes difficult for the second process gas flowing toward the center area C to reach the center area C owing to the labyrinth structure part 110. Hence, the first and the second process gases are prevented from mixing with each other in the center area C.

Further, by providing the labyrinth structure part 110, $N_2$ gas, being supplied to the center area C from above the center area C, is prevented from rapidly spreading in the peripheral direction. This is because the flow rate of the $N_2$ gas decreases as the $N_2$ gas attempts to overcome the first and the second wall parts 111, 112a, 112b. Although the $N_2$ gas attempts to enter the significantly narrow area between the rotation table 2 and the projecting part 92, the $N_2$ gas flows toward a wider area (e.g., first and second process areas P1, P2) because the flow rate of the $N_2$ gas is reduced by the labyrinth structure part 110. Accordingly, the $N_2$ gas is prevented from flowing to the area below the housing 90. As described below, the $N_2$ gas is also prevented from flowing to the space at below the housing 90 (plasma space 10) because the plasma space 10 has a positive pressure compared to other areas in the vacuum chamber 1.

As illustrated in FIG. 1, a heater unit (heating mechanism) 7 is provided in the space between the rotation table 2 and the bottom surface part 14 of the vacuum chamber 1. The heater unit 7 heats the wafer W placed on the rotation table 2 via the rotation table 2. The wafer W is heated to a temperature of, for example, 300° C. In FIG. 1, reference numeral 71a indicates a cover member provided at the side of the heater unit 7, and reference numeral 7a indicates another cover member for covering a top side of the heater unit 7. In this embodiment, plural purge gas supply pipes 73 are provided in a circumferential direction at the bottom surface part 14 of the vacuum chamber 1 below the heater unit 7.

As illustrated in FIGS. 2 and 3, the transfer opening 15 is formed in a sidewall of the vacuum chamber 1 for conveying the wafer W between an external transfer arm (not illustrated) and the rotation table 2. The transfer opening 15 can be opened and hermetically sealed (closed) by a gate valve (not illustrated). The recess part 24 receives the wafer W transferred from the transfer arm at an area facing the transfer opening 15. Accordingly, elevation pins (not illustrated) for penetrating the recess parts 24 and raising/lowering the recess part 24 and an elevation mechanism of the elevation pins (not illustrated) are provided below the rotation table 2 in an area corresponding to the area in which the wafer W is received.

The film deposition apparatus 1000 includes a control part 120 including a computer for controlling operations of the entire film deposition apparatus 1000. The control part 120 has a memory (e.g., CPU, central processing unit) in which a program for causing the control part 120 to perform the below-described film deposition process and modification process is stored. A group of steps are assembled to the program for executing the operations of the film deposition apparatus 1000. The program is read out and loaded in the control part 120 from a storage part 121 including a recording medium such as a hard disk, a compact disk, a magneto-optical disk, a memory card, or a flexible disk.

Next, effects of the film deposition apparatus 1000 according to an embodiment of the present invention are described. First, a gate valve is opened. Then, one or more wafers (in this embodiment, 5 wafers) from the transfer opening 15 are mounted to the rotation table 2. A wiring embedding process is performed on the wafers W by using a dry-etching process or a chemical vapor deposition (CVD) process. Then, the gate valve is closed so that the inside of the vacuum chamber 1 is evacuated by the vacuum pump 64. In the evacuated state, the wafers W are heated to, for example, 300° C. by the heater unit 7 while the wafers W are rotated in a clockwise direction at a rate of, for example, 120 rpm by the rotation table 2.

Then, Si containing gas and the $O_3$ gas are ejected from the first and the second process gas nozzles 31, 32. Further, a mixed gas of Ar gas and $O_2$ gas (e.g., 5 slm) is ejected from the plasma generation gas nozzle 34. The separation gas is ejected from the first and the second separation gas nozzles 41, 42 at a predetermined flow rate. Further, $N_2$ gas is ejected from the separation gas supply pipe 51 and the purge gas supply nozzle 72 at a predetermined flow rate. Then, the pressure inside the vacuum chamber 1 is adjusted to, for example, 400-300 Pa (in this embodiment, 500 Pa) by the pressure adjustment valve 65. Further, high frequency power is supplied to the first and the second plasma generation parts 81, 82, so the voltage of the first and the second plasma generation parts 81, 82 becomes, for example, 1500 W and 1000 W, respectively.

The $O_3$ gas and the $N_2$ gas (flowing toward the housing 90 from the upstream side of the housing 90 with respect to the rotation direction of the rotation table 2) can be prevented from being disrupted by the housing 90 owing to the gas flow path 101 formed in the side ring 100 at the outer side of the housing 90. That is, the $O_3$ gas and the $N_2$ gas are evacuated by flowing through the gas flow path 101 in a manner avoiding the housing 90.

Although a portion of the $O_3$ gas and the $N_2$ gas flowing toward the housing 90 from the upstream side of the housing 90 with respect to the rotation direction of the rotation table 2 may attempt to enter the area below the housing 90, the $O_3$ gas and the $N_2$ gas can be blocked out from the housing 90 owing to the projecting part 92 covering the area below the housing 90 and the gas ejection hole 33 of the plasma generation gas nozzle 34 facing obliquely downward toward the upstream side of the rotation direction of the rotation table 2. Accordingly, the plasma generation gas ejected from the plasma generation gas nozzle 34 collides with an area below the projecting part 92 and blocks out the $O_3$ gas and the $N_2$ gas attempting to enter the area below the housing 90. Then, the plasma generation gas is deflected by the projecting part 92 toward the downstream side of the rotation direction of the rotation table 2. The plasma space 10 below the housing 90 has a pressure that is approximately 10 Pa more positive than that of the other areas inside the vacuum chamber 1 by providing the projecting part 92 and setting the flow rate of each of the $O_3$ gas, the $N_2$ gas, and the plasma generation gas. As a result, the $O_3$ gas and the $N_2$ gas are prevented from entering the area below the housing 90.

Further, although the $O_3$ gas and the $N_2$ gas may attempt to enter the center area C, the $O_3$ gas and the $N_2$ gas can be blocked out from the center area C owing to the labyrinth structure part 110 in which the $O_3$ gas and the $N_2$ gas are forced backed to their initial first and second process areas P1, P2 by the separation gas supplied to the center area C from above the center area C. Accordingly, the $O_3$ gas and the $N_2$ gas can be prevented from mixing with each other in the center area C. Similarly, the $N_2$ gas ejected from the center area C toward the outer periphery is prevented from entering the area below the housing 90 by the labyrinth structure part 110.

Figure 12:
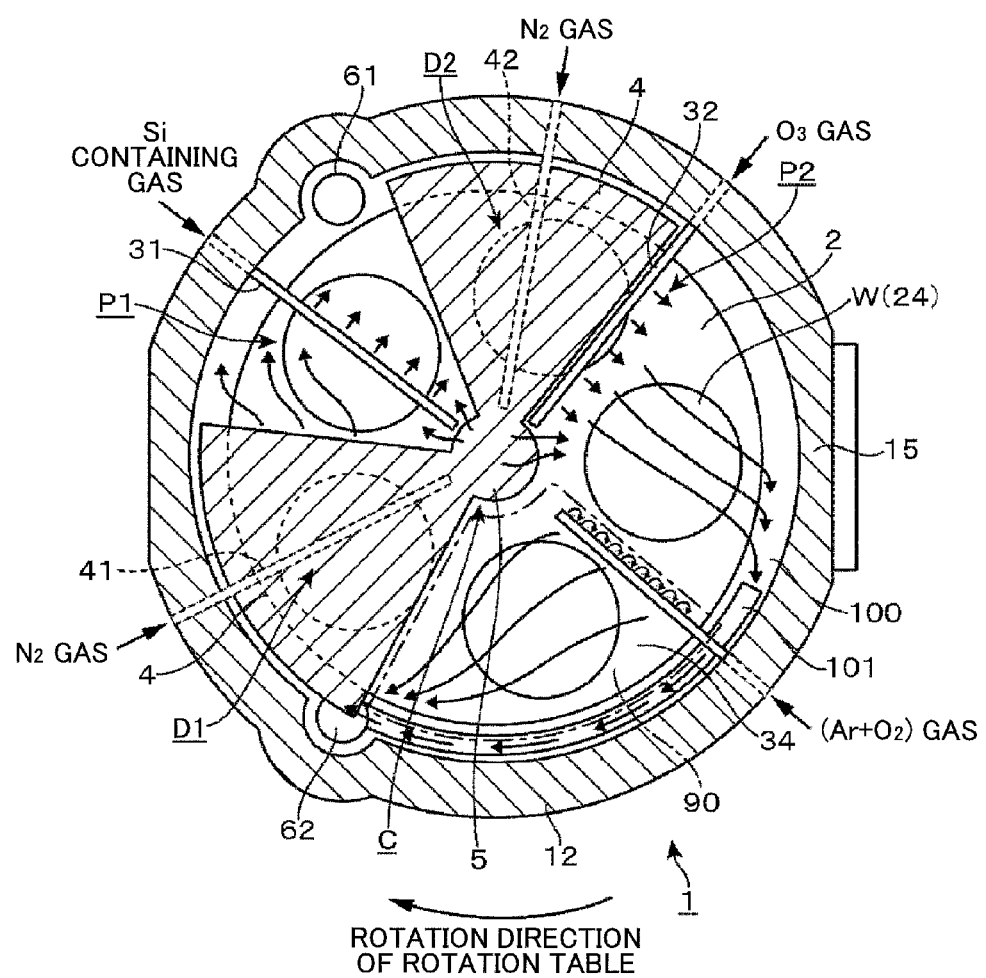
FIG. 12 is a schematic view for describing the flow of gases in a film deposition apparatus according to an embodiment of the present invention.

Further, as illustrated in FIG. 12, because $N_2$ gas is supplied between the first process area P1 and the second process area P2, the Si containing gas, the $O_3$ gas, the plasma generation gas can be evacuated without mixing with each other. Further, because purge gas is supplied to the area below the rotation table 2, gases can be prevented from spreading in the area below the rotation table 2 by being forced toward the first and the second evacuation ports 61, 62.

Figure 13:
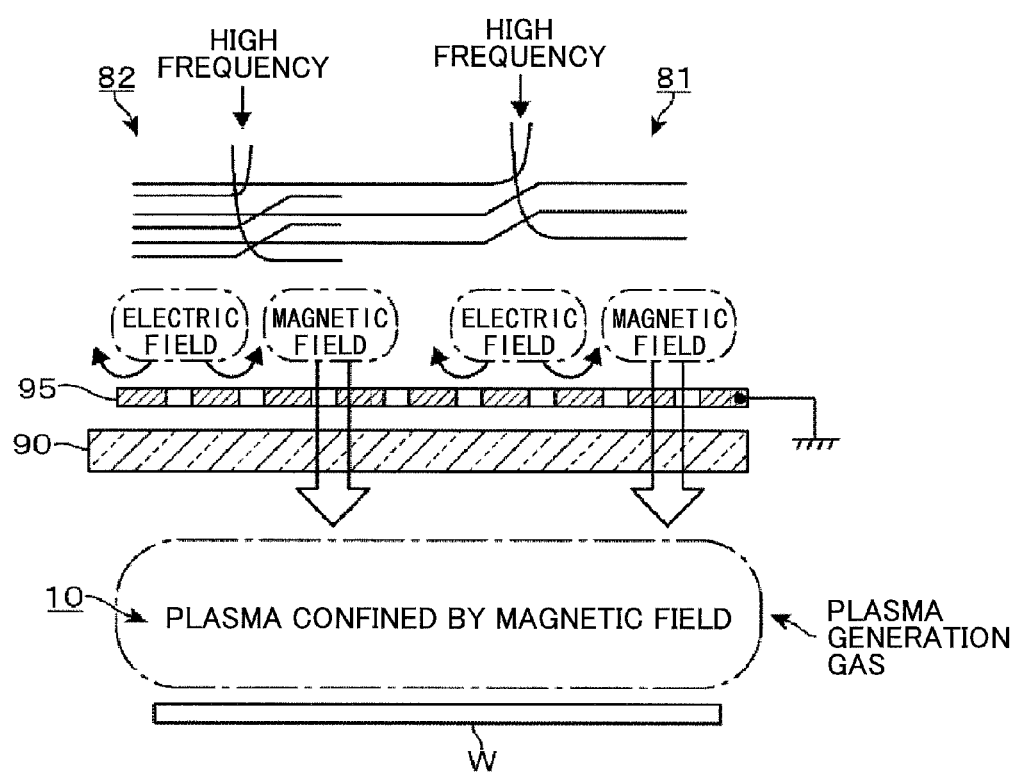
FIG. 13 is a schematic view for describing generation of plasma in a film deposition apparatus according to an embodiment of the present invention.

As illustrated in FIG. 13, an electric field and a magnetic field are generated in the first and the second plasma generation parts 81, 82 by high frequency power supplied from the high frequency power source 85. The generated electric field is prevented from reaching the inside of the vacuum chamber 1 (blocked) by being reflected or absorbed (attenuated) by the faraday shield 95. Meanwhile, the generated magnetic field passes through the slits 97 formed in the faraday shield 95 and reaches the inside of the vacuum chamber 1 via the bottom surface of the housing 90. Because no slits 97 are formed in the peripheral direction of the faraday shield 95 at the sides of the first and the second plasma generation parts 81, 82, the electric field and the magnetic field are prevented from rounding about to the area below the faraday shield 95 via the sides of the faraday shield 95.

Accordingly, by activating the plasma generation gas ejected from the plasma generation gas nozzle 34 with the magnetic field that has passed through the slits 97, plasma (e.g., ions, radicals) is generated. The strength of the plasma generated inside the vacuum chamber 1 becomes larger at the outer peripheral part of the rotation table 2 than at the center part of the rotation table 2 because two plasma generation parts 80 (i.e. first and second plasma generation parts 81, 82) are provided. It is to be noted that FIG. 13 is a schematic diagram illustrating the first and the second plasma generation parts 81, 82. Thus, the first and the second plasma generation parts 81, 82, the faraday shield 95, the housing 90, and the wafer W are illustrated in an enlarged manner in FIG. 13.

By rotating the rotation table 2, the Si containing gas is adsorbed to the surface of the wafer W at the first process area P1 and then one or more molecular layers of silicon oxide ($SiO_2$) film (thin film component) is formed by oxidizing the Si containing gas adsorbed to the surface of the wafer W at the second process area P2. As a result, a reaction product is formed. Impurities such as moisture (OH group) or an organic material may be contained inside the silicon oxide film due to residual groups contained inside the Si containing gas.

Then, modification of the silicon oxide film is performed by allowing plasma (active species) to contact the surface of the wafer W. More specifically, the impurities may be discharged from the silicon oxide film, or elements inside the silicon oxide film may be rearranged by the plasma colliding against the surface of the wafer W, so that high densification of the silicon oxide film can be achieved.

The degree of modification tends to become smaller at the outer peripheral part of the rotation table 2 than at the center part of the rotation table 2 by rotating the rotation table 2 because the circumferential speed is faster at the outer peripheral part of the rotation table 2 than at the center part of the rotation table 2. However, because the strength of plasma is stronger at the outer peripheral part of the rotation table 2 than at the center part of the rotation table 2, the degree of modification becomes uniform (consistent) in the radial direction of the rotation table 2. By continuing the rotation of the rotation table 2, adsorption of Si containing gas to the surface of the wafer W, oxidation of the components of the Si containing gas adsorbed to the surface of the wafer W, and plasma modification of the reaction product are successively performed multiple times. Thereby, a thin film including multiple layers of the reaction product is formed.

Although an electric wiring structure is formed inside the wafer W, electric damage of the electric wiring structure can be prevented because the faraday shield 95 provided between the plasma generation part 80 and the wafer W blocks off the generated electric field.

In performing the modification of the reaction product by providing the plasma generation part 80 according to the above-described embodiment, the housing 90 is to be installed in the plasma generation part 80 and the faraday shield 95 is to be provided between the plasma generation part 80 and the wafer W. Thereby, the electric field generated by the plasma generation part 80 is blocked off while the magnetic field generated by the plasma generation part 80 reaches the inside of the vacuum chamber 1 by passing through the slits 97 formed in the faraday shield 95. Accordingly, the modification process can be performed by reducing the electric damage to the electric wiring structure inside the wafer W. Hence, a thin film having a satisfactory film quality and electric characteristic can be obtained.

As described in the below-described embodiments, the damage (e.g., etching damage) from the plasma to a quartz material such as the housing 90 can be reduced by providing the faraday shield 95. Accordingly, the lifespan of the quartz material can be increased. Further, generation of contamination can be reduced. Further, the unevenness of the film thickness caused by impurities or the like mixed in the thin film ($SiO_2$) can be prevented.

The first and the second plasma generation parts 81, 82 can be placed close to the wafer W. Accordingly, even in a high pressure atmosphere which is high enough to perform film deposition (low degree of vacuum), a modification process can be performed satisfactorily by preventing the ions and radicals inside plasma from being deactivated. Because the projecting part 92 is provided in the housing 90, the O-ring 11*d* can be prevented from being exposed to the plasma space 10. Accordingly, for example, a fluorine type component contained in the O-ring 11*d* can be prevented from entering the wafer W, and the O-ring can attain a long lifespan.

Further, as described above, the projecting part 92 is formed at the bottom surface of the housing 90, and the gas ejection hole 33 of the plasma generation gas nozzle 34 is formed facing an upstream side with respect to the rotation direction of the rotation table 2. Accordingly, $O_3$ gas and $N_2$ gas can be prevented from entering the area below the housing 90 even in a case where only a small amount of gas is ejected from the plasma generation gas nozzle 34. The pressure of the area in which the plasma generation gas nozzle 34 is provided (plasma space 10) is higher than the pressure of other areas in the vacuum chamber 1 (e.g., first and second process areas P1, P2). Accordingly, the generation of NOx gas in the plasma space 10 can be prevented. Accordingly, the parts and components inside the vacuum chamber 1 can be prevented from being corroded by NOx gas. Thus, metal contamination of the wafer W can be prevented. Hence, because the $O_3$ gas and $N_2$ gas are prevented from entering the area below the housing 90 no evacuation port, no additional component (e.g., evacuation port, pump) is to be provided between the housing 90 and the second process gas nozzle 32 in a case where a film deposition process and a modification process is performed with the same film deposition apparatus 1000. In addition, no separation area D is to be provided between the housing 90 and the nozzle 32. Accordingly, the configuration of the film deposition apparatus 1000 can be simplified.

Further, because the gas flow path 101 is formed in the side ring 100 toward the outer periphery of the housing 90, each gas can be prevented from flowing toward the housing 90 and satisfactorily evacuated.

Further, because the first and second plasma generation parts 81, 82 are installed in the housing 90, the first and the second plasma generation parts 81, 82 can be placed in an area of atmospheric pressure (area outside the vacuum chamber 1). Accordingly, maintenance of the first and the second plasma generation parts 81, 82 is simplified.

Further, because the first and the second plasma generation parts 81, 82 are installed in the housing 90, the end part of the first plasma generation part 81 toward the center area C is separated from the rotation center of the rotation table 2 at a distance equivalent to the thickness of the sidewall of the housing 90. This makes it difficult for plasma to reach an end part of the wafer W toward the center area C (see below-described simulation results). On the other hand, if the housing 90 (first plasma generation part 81) is positioned toward the center area C in order to allow the plasma to reach the end part of the wafer W toward the center area, the space of the center area C would become narrow and cause process gases to mix with each other at the center area C. However, according to the above-described embodiment of the present invention, the labyrinth structure part 11 is formed at the center area C and blocks the path where gases flow toward the center area C. Accordingly, a wide plasma space 10 can be attained in the radial direction of the rotation table 2 while preventing processes gases from mixing with each other at the center area C and preventing the $N_2$ gas from flowing into the plasma space 10.

The degree in which modification is performed on the wafer W can be controlled to be consistent in the radial direction of the rotation table 2 by providing the first and the second plasma generation parts 81, 82. Accordingly, the wafer W can attain obtain a thin film having a consistent film property in the in-plane direction of the wafer W.

In the above-described embodiment, the film deposition process of the reaction product and the modification process of the reaction product are performed alternately. However, alternatively, the modification process may be performed after forming (depositing) a multilayer reaction product having approximately 70 layers (film thickness of approximately 10 nm). For example, the supply of high frequency power to the first and the second plasma generation parts 81, 82 is stopped during a film deposition process of the reaction product by supplying the Si containing gas and the $O_3$ gas. Then, the supply of the Si containing gas and the $O_3$ gas is stopped after a multilayer reaction product is obtained. Then, high frequency power is supplied to the first and the second plasma generation parts 81, 82. Even where the modification process is perform at once (instead being performed alternately with the film deposition process), the same effects can be attained by performing the film deposition process and the modification process alternately.

Figure 14:
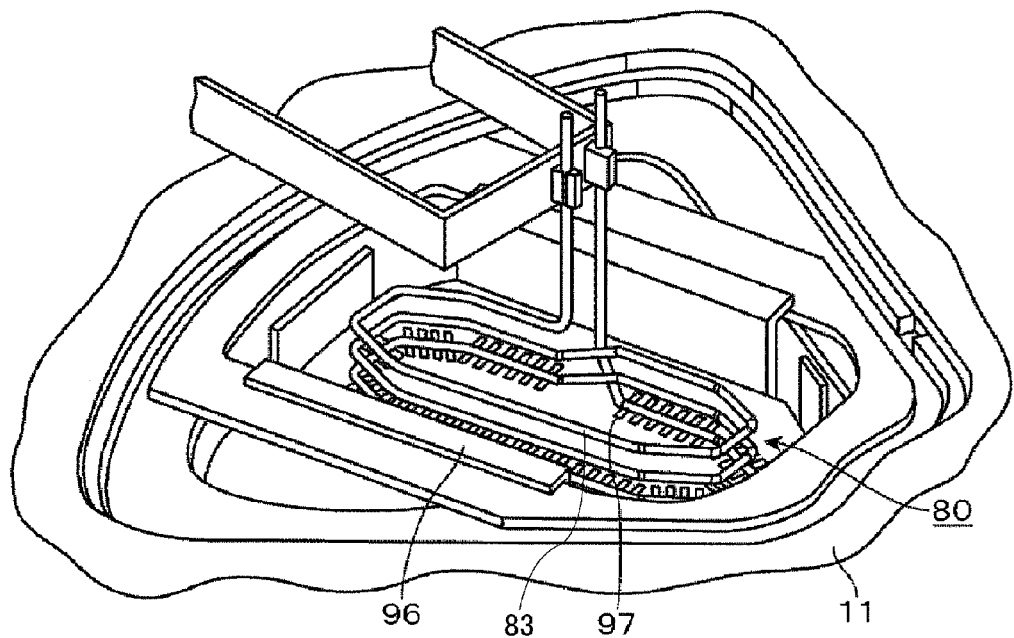
FIG. 14 is a perspective view illustrating a part of a film deposition apparatus according to another embodiment of the present invention.
Figure 15:
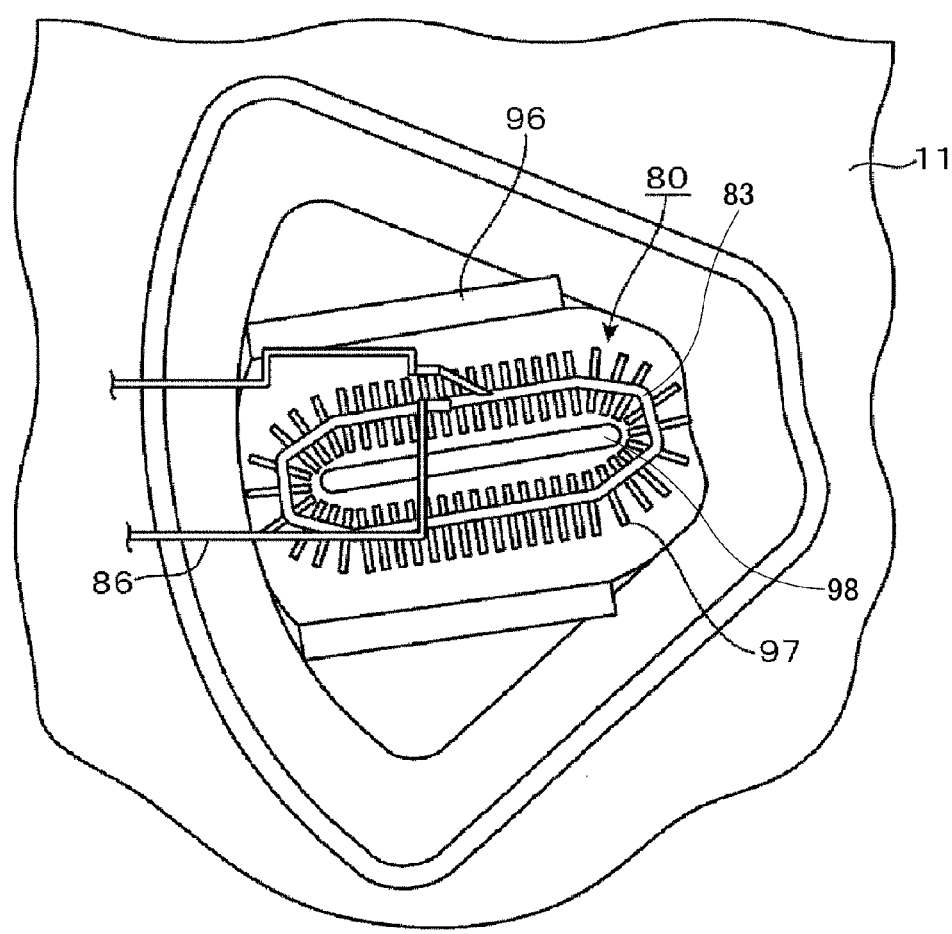
FIG. 15 is a plan view illustrating a part of a film deposition apparatus according to another embodiment of the present invention.

Next, the film deposition apparatus 1000 according to other embodiments of the present invention are described with reference to the drawings. FIGS. 14 and 15 illustrate an embodiment of the present invention in which a single plasma generation part 80 is provided. In the embodiment illustrated in FIGS. 14 and 15, the plasma generation part 80 has a substantially quadrate shape (in this embodiment, a substantially octagonal shape) from a plan view and includes an antenna 83 having a shape matching the substantially quadrate shape of the plasma generation part 80. Similar to the above-described embodiments, although the width d1 of the slits 97 increases the farther away from the opening part 98, FIGS. 14 and 15 do not illustrate the increasing width of the slits 97.

Figure 16:
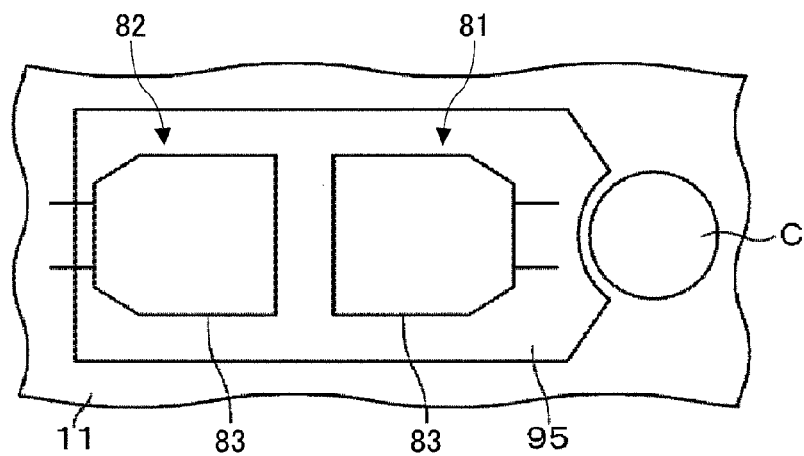
FIG. 16 is a plan view illustrating a part of a film deposition apparatus according to another embodiment of the present invention.
Figure 17:
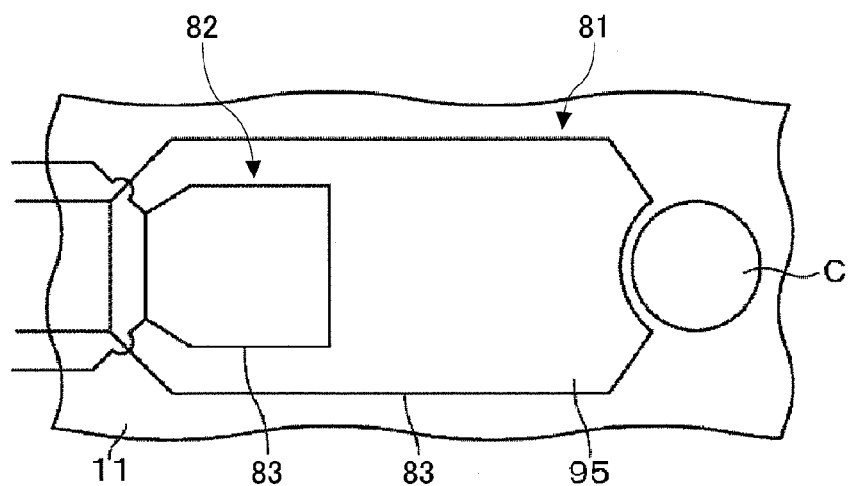
FIG. 17 is a plan view illustrating a film deposition apparatus according to another embodiment of the present invention.

FIG. 16 illustrates an embodiment of the present invention in which two plasma generation parts 80 (first and second plasma generation parts 81, 82) having substantially quadrate shapes. In the embodiment illustrated in FIG. 16, the first plasma generation part 81 is positioned inward with respect to the radial direction of the rotation table 2 and the second plasma generation part 82 is positioned outward with respect to the radial direction of the rotation table 2. In the embodiment illustrated in FIG. 16, the antenna 83 of the first plasma generation part 81 and the antenna 83 of the second plasma generation part 82 are wound into a shape having area (size) equal to each other. FIG. 16 is a schematic plan view (i.e. viewed from the ceiling plate 11) of the antenna 83 of the first and the second plasma generation parts 81, 82 according to an embodiment of the present invention. FIG. 17 is also a schematic plan view (i.e. viewed from the ceiling plate 11) of the antenna 83 of the first and the second plasma generation parts 81, 82 according to another embodiment of the present invention.

In the embodiment illustrated in FIG. 17, the first and second plasma generation parts 81, 82 also have substantially quadrate shapes. In this embodiment, however, the first plasma generation part 81 has an antenna 83 formed throughout the radial direction of the rotation table 2 whereas the second plasma generation part 82 has an antenna 83 formed in an area toward an outer peripheral part of the rotation table 2.

Figure 18:
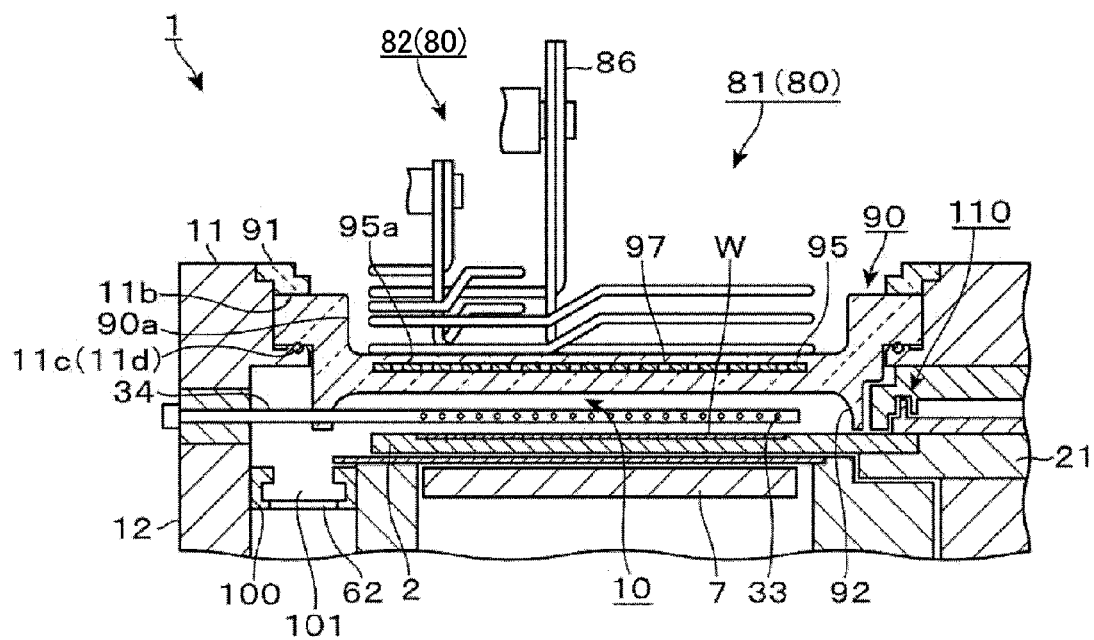
FIGS. 18-20 are vertical cross-sectional views illustrating parts of a film deposition apparatus according to another embodiment of the present invention.

FIG. 18 illustrates an embodiment of the present invention in which the faraday shield 95 is embedded (buried) inside the housing 90. For example, the housing 90 below the plasma generation parts 80 includes a detachable upper end plane. By detaching the upper end plane from the housing 90, the faraday shield 95 can be installed inside the housing 90. In other words, the faraday shield 95 in this embodiment may be provided in other positions as long as the faraday shield 95 is provided between the plasma generation part 80 and the wafer W.

Figure 19:
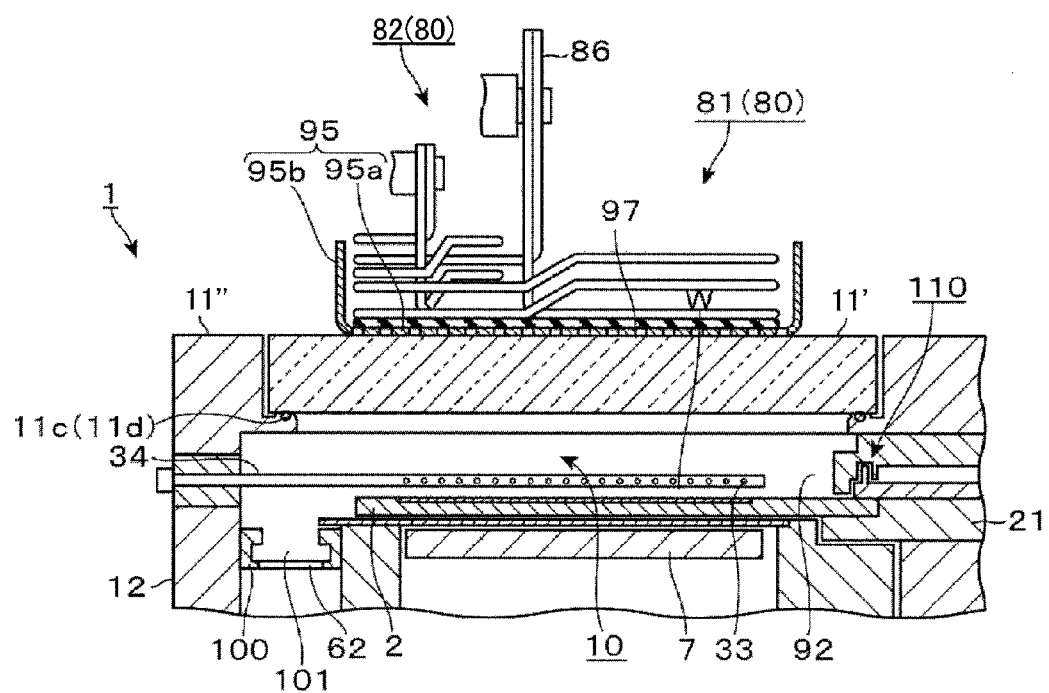

FIG. 19 illustrates an embodiment of the present invention in which the plasma generation part 80 and the faraday shield 95 are provided above the ceiling plate 11 instead of providing the plasma generation part 80 and the faraday shield 95 inside the housing 90. In the embodiment illustrated in FIG. 19, a portion 11' of the ceiling plate 11 provided below the plasma generation part 80 is formed of a material different from that of another portion 11" of the ceiling plate 11. For example, the portion 11' of the ceiling plate 11 provided below the plasma generation part 80 is formed of a dielectric material such as quartz. A bottom peripheral rim part of the portion 11' of the ceiling plate 11 is hermetically connected to the other portion 11" of the ceiling plate 11 by an O-ring 11d formed throughout the peripheral direction.

Figure 20:
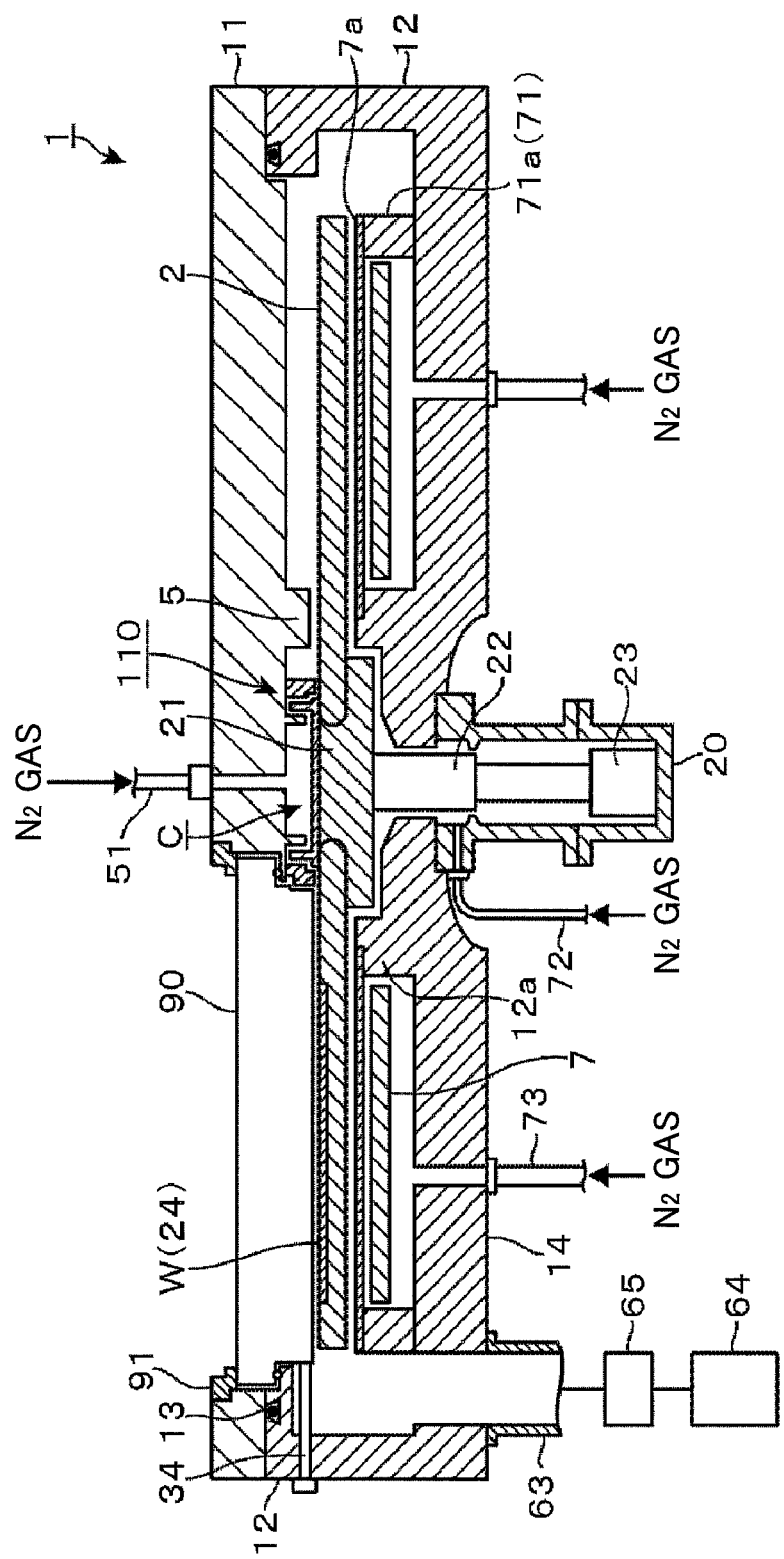

FIG. 20 illustrates an embodiment of the present invention in which no side ring 100 is provided in the vacuum chamber 1. As described above, the side ring 100 is for preventing cleaning gas from entering an area below the rotation table 2 during a process of cleaning the vacuum chamber 1. Accordingly, in a case where no cleaning process is performed, the vacuum chamber 1 may be without the side ring 100.

Figure 21:
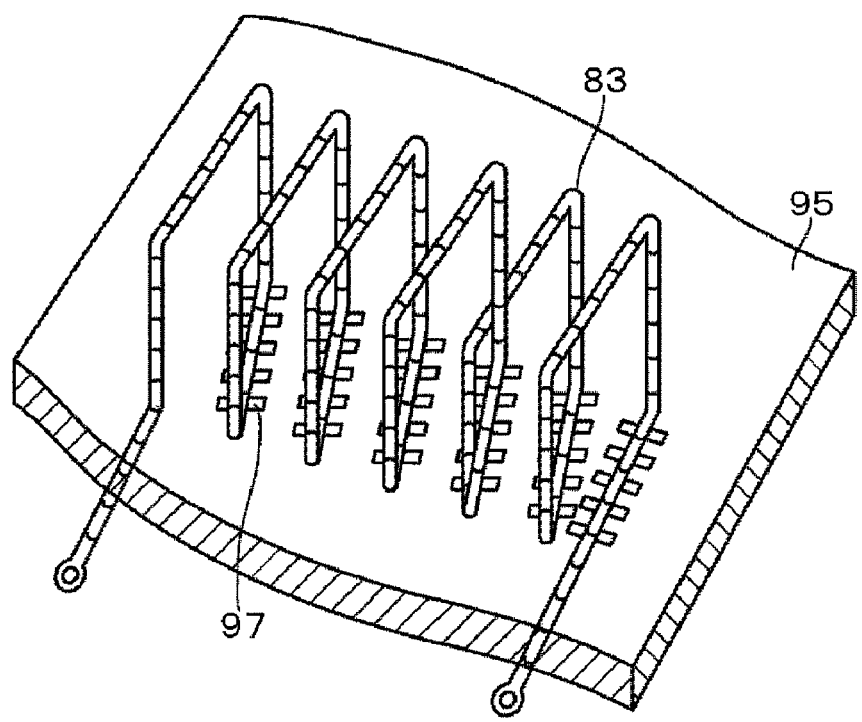
FIG. 21 is a perspective view illustrating a part of a film deposition apparatus according to another embodiment of the present invention.

FIG. 21 illustrates an embodiment of the present invention in which the antenna 83 is wound in a horizontal direction instead of a vertical direction. More specifically, the antenna 83 is wound around an axis arcuately extending along the radial direction of the rotation table 2. It is to be noted that parts/components other than the antenna 83, the slits 97, and the faraday shield 95 are not illustrated in FIG. 21.

Figure 22:
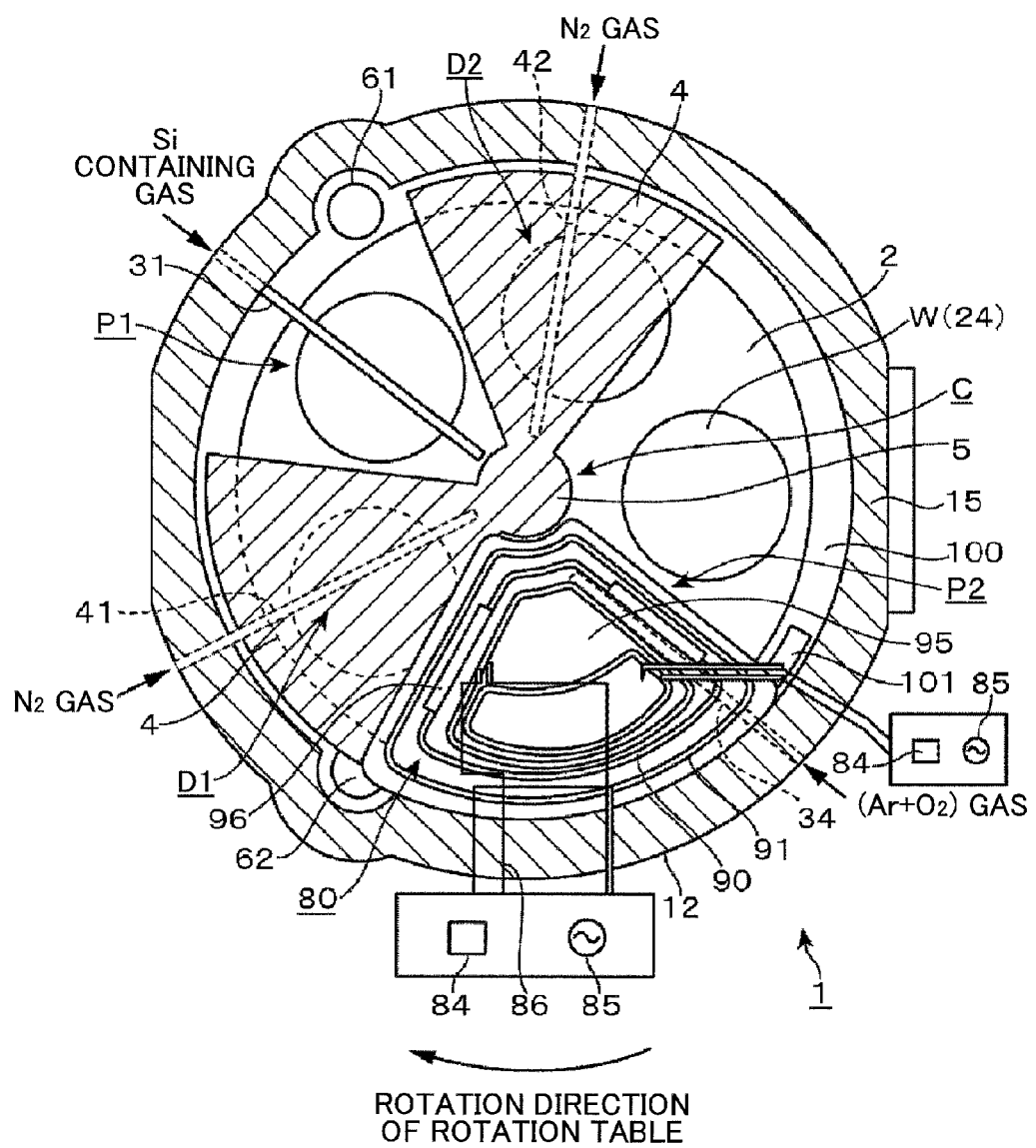
FIG. 22 is a plan view illustrating a part of a film deposition apparatus according to another embodiment of the present invention.

In the above-described embodiments, a reaction product is deposited on the wafer W by sequentially supplying Si containing gas and $O_3$ gas to the wafer W in this order. Then, the modification process is performed on the reaction product with the plasma generation part 80. Alternatively, plasma may be generated with the $O_3$ gas used in depositing the reaction product. That is, in the embodiment illustrated in FIG. 22, the second process gas nozzle 32 is not provided in the vacuum chamber 1. In this embodiment, a reaction product is formed by oxidizing the components of Si containing gas adsorbed on the surface of the wafer W in the plasma space 10. Then, the modification process is performed on the reaction product in the plasma space 10. In other words, the plasma generation gas supplied to the plasma space 10 is also used as the second process gas. Thus, the plasma generation gas nozzle 34 is used as a second process gas nozzle. Accordingly, no ozonizer as that of the above-described second process gas nozzle 32 is needed, because the components of the Si containing gas adsorbed to the surface of the wafer W are oxidized in the plasma space 10 by the plasma generation gas nozzle 34. Accordingly, the manufacturing cost of the film deposition apparatus 1000 can be reduced. Further, by generating $O_3$ gas immediately above the wafer W, the length of the flow path of $O_3$ gas can be shortened to the extent of the length of the second process gas nozzle 32. Accordingly, $O_3$ gas can be prevented from deactivating. As a result, the components of the Si containing gas can be satisfactorily oxidized.

It is preferable for the material of the faraday shield 95 to have a relative magnetic permeability as low as possible so that magnetic field can permeate through the faraday shield 95 as much as possible. For example, the material of the faraday shield 95 may be silver (Ag) or aluminum (Al). Further, in a case where the number of slits 97 formed in the faraday shield 95 is too small, only a small amount of magnetic field can reach the inside of the vacuum chamber 1. In a case where the number of slits 97 formed in the faraday shield 95 is too large, it would be difficult to manufacture the faraday shield 95. Accordingly, it is preferable for the number of slits 97 formed in the faraday shield 95 to be approximately 100-500 per an antenna 83 having a length of 1 m. Further, in the above-described embodiment of the present invention, the plasma generation gas nozzle 34 is positioned in a manner having the gas ejection hole 33 facing the upstream side with respect to the rotation direction of the rotation table 2. Alternatively, the plasma generation gas nozzle 34 may be positioned in a manner having the gas ejection hole 33 facing downward and/or toward the downstream side with respect to the rotation direction of the rotation table 2.

Alternatively, the material of the housing 90 may be a plasma-etch resistant material (e.g., alumina ($Al_2O_3$), yttria) instead of quartz. Alternatively, the housing 90 may be formed with, for example, Pyrex (heat resistant glass manufactured by Corning Inc., Registered Trademark) glass coated with a plasma etch resistant material. In other words, it is preferable for the housing 90 to be formed of a material having a high plasma resistant property and high magnetic permeability (dielectric material).

In the above-described embodiments, the insulation plate 94 is mounting above the faraday shield 95 for insulating the faraday shield 95 and the antenna 83 (plasma generation part 80). Alternatively, instead of mounting the insulation plate 94, the antenna 83 may be coated with an insulating material such as quartz.

In the above-described embodiments, a silicon oxide film is deposited by using a Si containing gas and $O_3$ gas. Alternatively, a silicon nitride film may be deposited by using a Si containing gas as the first process gas and an ammonia ($NH_3$) gas as the second process gas. In this case, the plasma generation gas may be, for example, an argon gas, a nitrogen gas, or an ammonia gas.

Alternatively, a titanium nitride film may be deposited by using a titanium chloride gas ($TiCl_2$) as the first process gas and an ammonia ($NH_3$) gas as the second process gas. In this case, a substrate formed of titanium is used as the wafer W, and an argon gas or a nitrogen gas is used as the plasma generation gas. Alternatively, a multilayer reaction product may be formed by sequentially supplying 3 or more types of process gases. For example, an STO thin multilayer film (an oxide film containing Sr and Ti) can be deposited by supplying $O_3$ gas to the wafer W after supplying a strontium (Sr) raw material and a titanium (Ti) raw material to the wafer W. The Sr raw material may be, for example, $Sr(THD)_2$ (strontium-bis-tetra-methyl-heptane-dionato) or $Sr\ (Me_5Cp)_2$ (bis-penta-methyl-cyclo-penta-di-enyl-strontium). The Ti raw material may be, for example, $Ti(OiPr)_2(THD)_2$ (titanium-bis-iso-propoxide-bis-tetra-methyl-heptane-dionato) or Ti(OiPr) (titanium-tetra-iso-propoxide). In the above-described embodiments, N2 gas is supplied from the first and the second separation gas nozzles 41, 42 to the first and the second separation areas D1, D2. Alternatively, a wall part for dividing the first and the second process areas P1, P2 may be provided in the first and second separation areas D1, D2 between the first and the second processes areas P1, P2. Thereby, the first and the second separation gas nozzles 41, 42 need be provided in the vacuum chamber 1.

In the above-described embodiments, the antenna 83 is placed in an area that is hermetically separated from the inside area of the vacuum chamber 1 (that is, placed inside the housing 90 or above the ceiling plate 11). Alternatively, the antenna 83 may be placed in an area inside the vacuum chamber 1. For example, the antenna 83 may be placed slightly below the bottom surface of the ceiling plate 11. In this case, the antenna 83 is coated with a dielectric material such as quartz, so that the antenna 83 can be prevented from being etched by plasma. Further, in this case, a surface of the faraday shield 95 between the antenna 83 and the wafer W may be coated with a dielectric material such as quartz. Further, the antenna may have a configuration other than the above-described coiled configuration. For example, the antenna 83 may have a configuration in which a base end of the antenna 83 is hermetically inserted to the inside of the vacuum chamber 1 from the outside of the vacuum chamber 1 and a distal end of the antenna 83 may extend in a straight line toward the center area C.

In the above-described embodiments, a protection cover (not illustrated) for protecting an inner wall surface of the vacuum chamber 1 and the ceiling plate 11 from each of the process gases (in a cleaning process, a cleaning gas supplied from the first and the second process gas nozzles 31, 32) is provided in a narrow space in an area more toward the process area than the inner wall surface of the vacuum chamber 1 and the ceiling plate 11. In the above-described embodiments, although purge gas is supplied to the narrow space of the protection cover from a gas supply part (not illustrated) so that the pressure of the narrow space is slightly positive pressure than a processing atmosphere, a detailed description of the purge gas is omitted.

In the embodiment illustrated in FIG. 8, the first plasma generation part 81 is formed for generating plasma throughout the radial direction of the rotation table 2 and the second plasma generation part 82 is formed for generating plasma in an area toward the outer periphery of the rotation table 2, so that the degree of plasma modification performed on the center area of the rotation table 2 and the outer peripheral area of the rotation table can be consistent (uniform). Alternatively, instead of using the first and the second plasma generation parts 81, 82, the degree of plasma modification can be adjusted by the arrangement of the slits 97 formed in the faraday shield 95.

In other words, as described above, the length of time of irradiating plasma onto the wafer W placed on the rotation table 2 is longer at a part of the wafer W toward the center area C of the rotation table 2 than at a part of the wafer W toward the outer periphery of the rotation table 2. Accordingly, the degree of plasma modification tends to be larger at the part of the wafer W toward the center area C than at the part of the wafer W toward the outer periphery of the rotation table 2. Accordingly, as described in the following embodiment of the present invention, the arrangement of the slits 97 of the faraday shield 95 may be adjusted so that the degree of plasma modification can be consistent (uniform) throughout the radial direction of the rotation table 2. For example, among the electric field and the magnetic field generated by the plasma generation part 80, the magnetic field having passed through the slits 97 of the faraday shield 95 generates the plasma inside the vacuum chamber 1. Accordingly, in the following embodiment of the present invention, the area (size) of the openings of the slits 97 is reduced, so that the magnetic field reaching the inside of the vacuum chamber 1 is weaker at the part of the wafer W toward the center area C than at the part of the wafer W toward the outer periphery of the rotation table 2.

Figure 23:
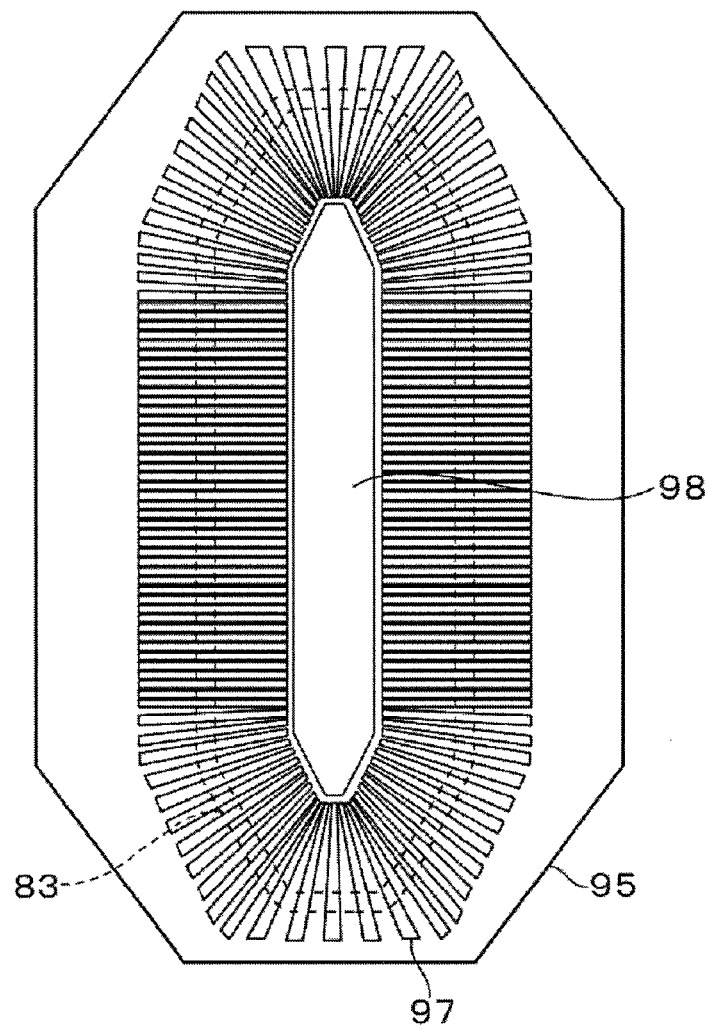
FIGS. 23-26 are plan views illustrating a faraday shield of a film deposition apparatus according to embodiments of the present invention.
Figure 24:
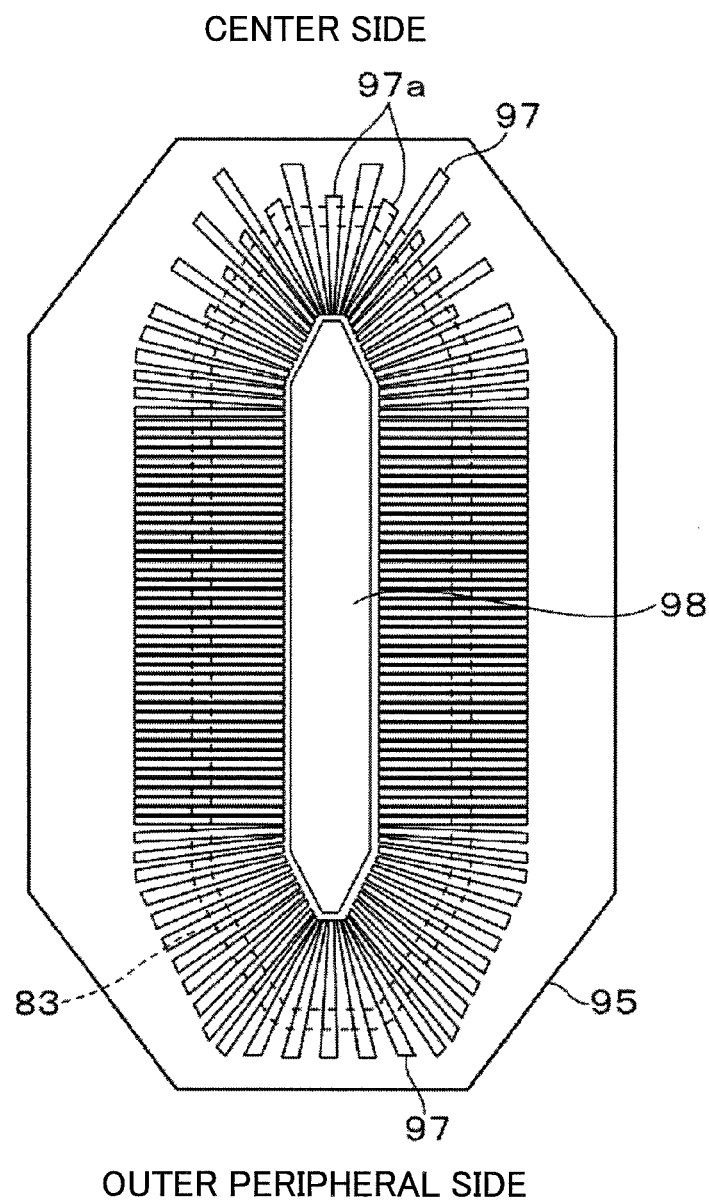
Figure 25:
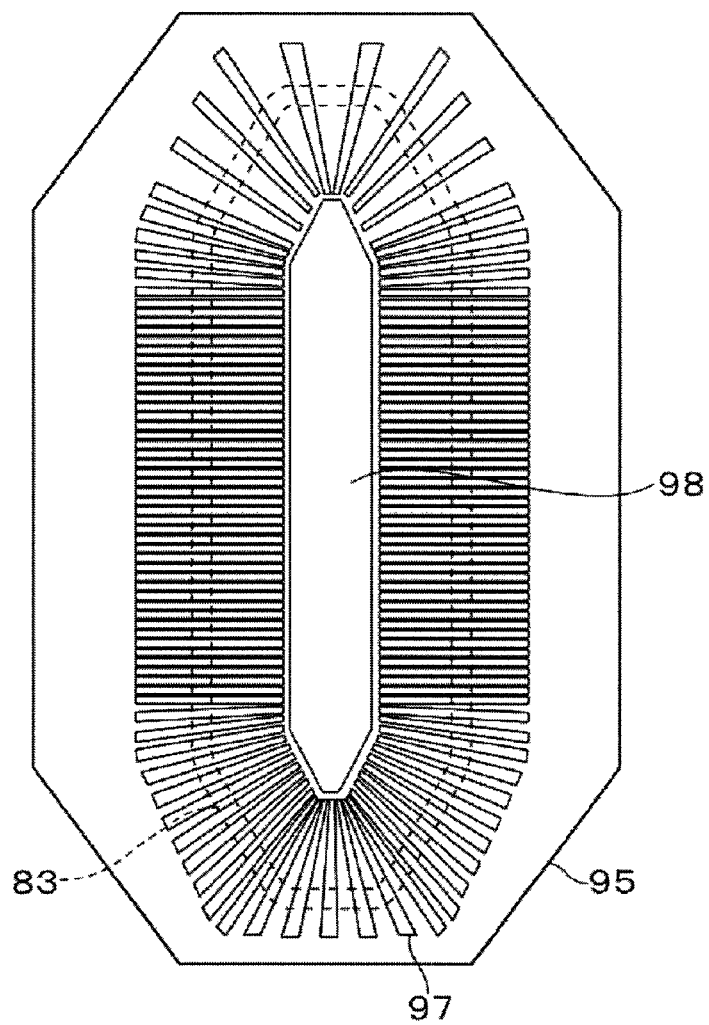
Figure 26:
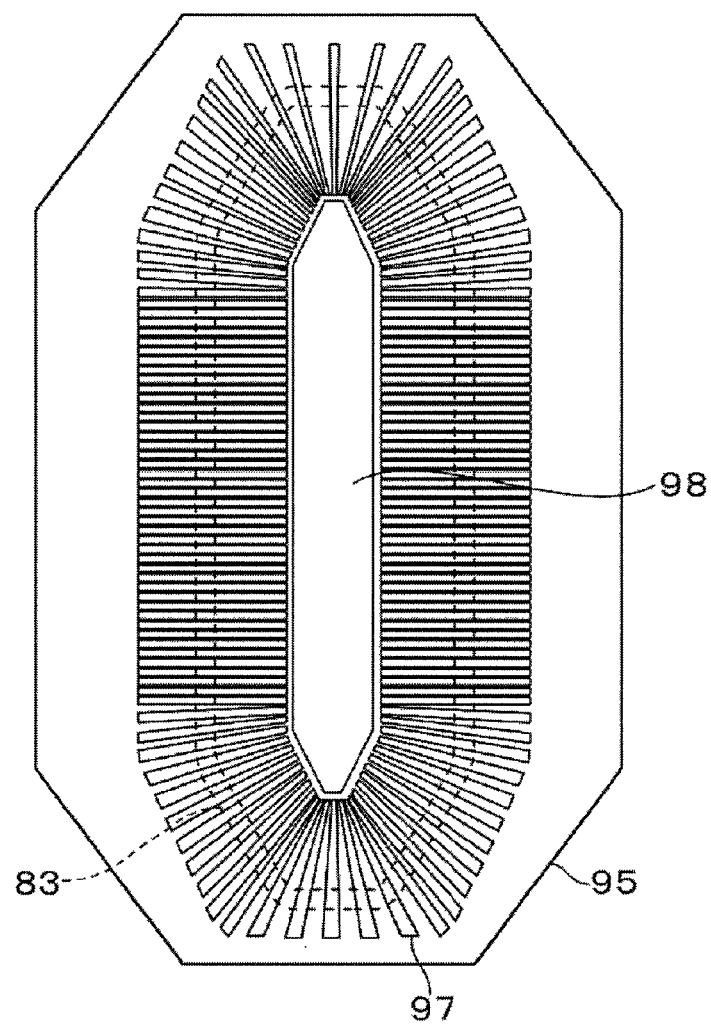

For example, in an embodiment having the adjusted arrangement of slits 97, the antenna 83 has an elongated octagonal shape as illustrated in FIG. 15, and a single plasma generation part 80 (i.e. only the first plasma generation part 81) is provided. First, the arrangement of slits 97 of FIG. 15 is described with reference to FIG. 23. Each of the slits 97 provided in the longitudinal direction of the antenna 83 (i.e. radial direction of the rotation table 2) has a substantially rectangular shape. Each of the slits 97 provided in the bending part of the antenna 83 (i.e. areas of the faraday shield 95 toward the center area C and the outer rim parts of the rotation table 2) has a wedge shape having a width d1 that becomes narrower toward the inner side of the coil area of the antenna 83. In the embodiment illustrated in FIG. 23 (FIG. 15), The slit 97 provided in the areas toward the center area C and the outer rim parts of the rotation table 2 are formed having the same width d1. It is to be noted that FIG. 23 illustrates the antenna 83 with broken lines in FIG. 23 and does not show parts/components other than those of the faraday shield 95. FIGS. 24-26 are illustrated in a similar manner as FIG. 23.

Next, another embodiment of adjusting the arrangement of the slits 97 of the faraday shield 95 (for attaining a consistent degree of plasma modification in the radial direction of the rotation table 2) is described. FIG. 24 illustrates an embodiment in which supplementary slits 97a are formed in an area of the faraday shield 95 toward the center area C. The supplementary slits 97a have a length shorter than that of the slits 97 provided in an area toward the outer peripheral part of the rotation table 2. For example, the supplementary slits 97a are, approximately 20 mm shorter than the slits 97. The supplementary slits 97 are formed extending from a position close to the opening part 98 to a position slightly toward the outer rim of the faraday shield 98 than the antenna 83. Further, the supplementary slits 97a and the slits 97 are alternately arranged in the area of the faraday shield 95 toward the center area C of the rotation table 2. In this embodiment, the supplementary slits 97a are formed in 9 parts in the area of the faraday shield 95 toward the center of the rotation table 2.

The distance d2 of the intervals between the slits 97 in the area of the faraday shield 95 toward the center area C of the rotation table 2 is longer than that of the intervals between the slits 97 in other areas of the faraday shield 95 to the extent of the supplementary slits 97a. In other words, as illustrated in FIG. 24, in forming the openings of the slits 97 with an area (size) that becomes smaller at the area toward the center area C than at the outer rim part of the rotation table 2, the length of the slits 97 is adjusted to a short length.

Hence, the degree of plasma modification in the radial direction of the rotation table 2 becomes consistent (uniform) by adjusting the arrangement of the slits 97 (see also the results of the following embodiments (experiments)). Accordingly, in a case where there is a desire to attain a consistent degree of plasma modification in the in-plane direction of the wafer W, the faraday shield 95 illustrated in FIG. 24 may be used. In a case where there is a desire to attain a larger degree of plasma modification in the area toward the center of the rotation table 2 than at the area toward the outer rim part of the rotation table 2, the faraday shield 95 illustrated in FIG. 23 may be used. Thus, a suitable faraday shield 95 can be selected in accordance with the recipe or process to be used. In this embodiment, both the slits 97 and the supplementary slits 97a are formed in the area toward the center of the rotation table 2, the slits in the area toward the center of the rotation table 2 may be replaced with the supplementary slits 97a, and the supplementary slits 97a may be formed in 10-50 parts in the faraday shield 95.

Further, the cost of the film deposition apparatus 1000 can be reduced by forming the antenna 83 into an elongated substantially octagonal shape. That is, in order for the magnetic field generated in the plasma generating part 80 to reach the inside of the vacuum chamber 1, the housing 90 is formed of high purity quartz. Further, the housing 90 has a size (from a plan view) larger than that of the antenna 83 so that the quartz housing 90 can be expands covering the bottom of the antenna 83. Accordingly, the larger the antenna 83, the larger the housing 90 is to be formed. This may mount up the cost of the film deposition apparatus 1000 (housing 90). Therefore, according to the above-described embodiments of the present invention, a part of the antenna 83 toward the upstream side with respect to the rotation direction of the rotation table 2 and a part of the antenna toward the downstream side with respect to the rotation direction of the rotation table 2 are positioned closed to each other, so that the size (from the plan view) of the housing 90 can be made as small as possible.

FIG. 25 illustrates an embodiment of the present invention in which the faraday shield 95 illustrated in FIG. 24 is formed without the supplementary slits 97a. The distance d2 of the interval between the slits 97 toward the center of the rotation table 2 illustrated in FIG. 25 is the same as the slits 97 toward the center of the rotation table 2 illustrated in FIG. 24. Compared to the slits 97 toward the center of the rotation table 2 of the faraday shield 95 illustrated in FIG. 24, the forming of a slit 97 is skipped so that a slit 97 is formed at every other slit space (instead of forming one slit after another at equal intervals). By increasing the distance d2 of the interval between the slits 97 (i.e. increasing the pitch of the slits 97) toward the center of the rotation table 2, the degree of plasma modification in the radial direction of the rotation table 2 can be uniform. The pitch of the slits 97 toward the center of the rotation table 2 may be, for example, approximately 4 mm to 12 mm. The slits 97 may become narrower from the center side to the outer rim side of the rotation table 2.

FIG. 26 illustrates an embodiment of the present invention in which the width d1 of the slits 97 toward the center of the rotation table 2 is narrower than the width d1 of the slits 97 toward the outer rim part of the rotation table 2. In this embodiment, the width d1 of the slits 97 toward the center of the rotation table 2 is, for example, 2 mm to 3 mm. In this embodiment, 9 slits 97 may be formed toward the center of the rotation table 2. The embodiment illustrated in FIG. 26 can attained the same effects as the above-described embodiments.

In the embodiments illustrated in FIGS. 24-26, in a case where the slits 97 toward the center of the rotation table 2 have openings with an area (size) smaller than those of the slits 97 toward the outer rim part of the rotation table 2, the length of the slits 97, the pitch of the slits 97, and the width of the slits 97 are adjusted, respectively. However, the adjustment of the length of the slits 97, the pitch of the slits 97, and the width of the slits 97 may be performed in combination. That is, in addition to making the length of the slits 97 toward the center of the rotation table 2 shorter than the length of the slits 97 toward the outer rim of the rotation table 2, the pitch of the slits 97 may be increased and/or the width d1 of the slits 97 may be reduced.

In the above-described embodiments of the present invention, the area (size) of the opening of the slits 97 toward the center of the rotation table 2 is smaller than the area (size) of the opening of the slits 97 toward the outer rim part of the rotation table 2. Alternatively, the area (size) of the opening of the slits 97 toward the outer rim part of the rotation table 2 may be increased. For example, the length of the slits 97 toward the outer rim part of the rotation table 2 may be more than the length of the slits 97 toward the center of the rotation table 2 and/or the width d1 of the slits 97 toward the outer rim part of the rotation table 2 may be more than the width d1 of the slits 97 toward the center of the rotation table 2. Further, the arrangement of the slits 97 toward the center of the rotation table 2 and the arrangement of the slits 97 toward the outer rim part of the rotation table 2 may also be adjusted. Further, the pitch between the slits 97 toward the center of the rotation table 2 and the pitch between the slits 97 toward the outer rim part of the rotation table 2 may also be adjusted. However, it is preferable to adjust the arrangement of the slits 97 toward the center of the rotation table 2 considering that the length and width d1 of the slits 97 toward the outer rim part of the rotation table 2 are made as large as possible and the pitch between the slits 97 toward the center of the rotation table 2 is made as small as possible.

In a case of forming two plasma generation parts 80 (i.e. first and second plasma generation parts 81, 82) or forming the antenna 83 in a substantially sector shape as illustrated in FIG. 8, the slits 97 of the faraday shield 95 may be adjusted in the manner illustrated in FIGS. 24-26.

EXAMPLES

Next, experiments results using the above-described embodiments of the film deposition apparatus 1000 are described.

Experiment 1

First, a film deposition apparatus without the labyrinth structure part 110 was evaluated. In this experiment, the length of the center area C was extended for preventing the process gases from mixing with each other at the center area C. Thus, in this experiment, the ends of the opening part 11a of the ceiling plate 11 and the housing 90 toward the rotation center of the rotation table 2 are positioned approximately 15 mm more toward the outer periphery of the rotation table 2 than the above-described embodiments illustrated in, for example, FIG. 1. In this experiment, a single plasma generation part 80 is provided in the film deposition apparatus in a manner illustrated in FIGS. 14 and 15. With the film deposition apparatus of this experiment, a film deposition process and a modification process were performed. It is to be noted that details on the conditions for performing the film deposition process and the modification process in the experiment are omitted.

Figure 27:
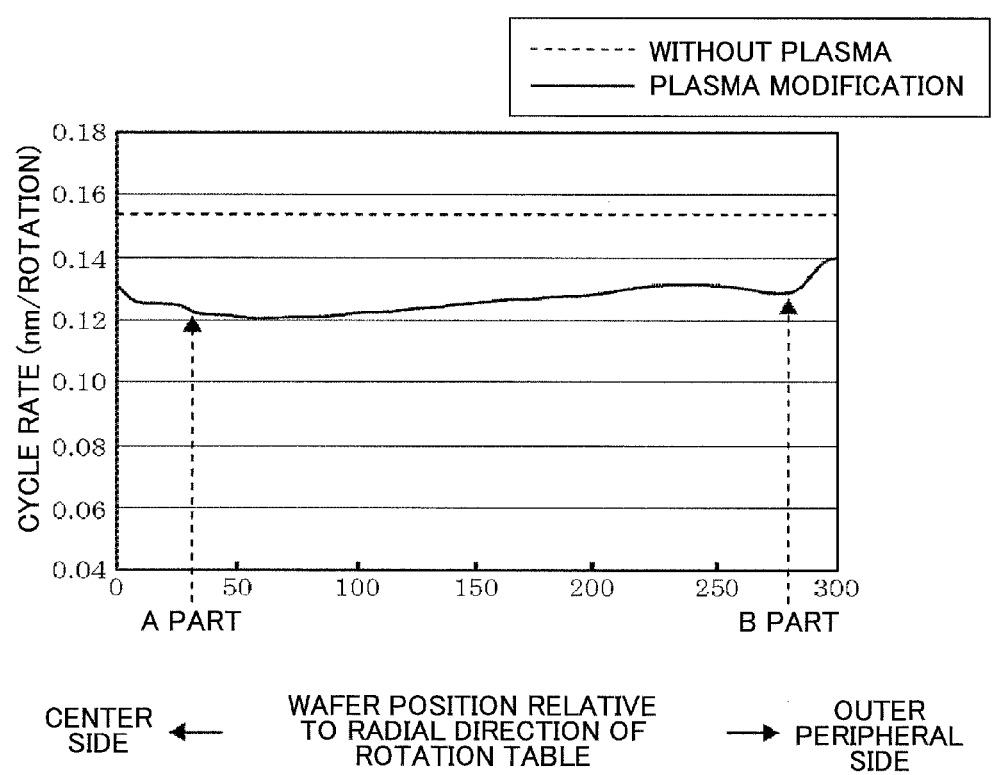

The results of experiment 1 are illustrated in FIG. 27. As illustrated in FIG. 27, the cycle rate has decreased by performing the plasma modification process compared to a case of not performing the plasma modification process. Thus, it can be understood that the density of the thin film can be enhanced and a rigid thin film can be obtained by performing the plasma modification process. Accordingly, even in a case where the faraday shield 95 is provided between the plasma generation part 80 and the wafer W, plasma can reach the wafer W.

Figure 28:
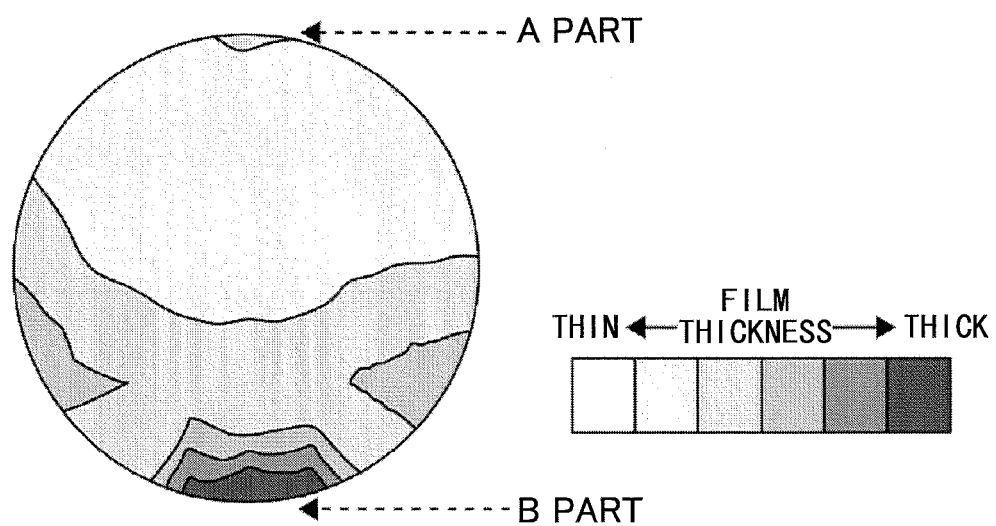

In experiment 1, the thickness of the wafer W toward the rotation center part and the outer peripheral part of the rotation table 2 is slightly greater than the thickness of an area toward the center of the wafer W (see, for example, the film thickness distribution of a thin film in FIG. 28). Accordingly, the strength of the plasma at the rotation center part and the outer peripheral part of the rotation table 2 is less compared to other areas of the rotation table 2. Accordingly, it is understood that it is preferable for the housing 90 (i.e. providing the labyrinth structure part 110) at a position toward the center of the rotation table 2. Further, it is understood that it is preferable to use a greater amount of plasma at the outer peripheral part than at the center part of the rotation table 2 (e.g., by supplying high frequency power at the outer peripheral part than the center part with the first and the second plasma generating parts 81, 82 or by forming the plasma generating part 80 in a sector shape). In FIG. 27, "cycle rate" indicates the amount of film deposition (film thickness) per single rotation of the rotation table 2.

Experiment 2

By the results of experiment 1, it is understood that the degree of modification performed on the center area C can be consistent with other areas by positioning the housing 90 close to the center area C. Thus, in this case, the space above the core part 21 (supporting the rotation table) becomes smaller (narrower) than the space below the core part 21. Due to the opening part 11a formed in the ceiling plate 11, the strength of the ceiling plate 11 may become insufficient. Accordingly, in experiment 2, the analysis of the strength of the ceiling plate was performed. In experiment 2, it is analyzed whether the ceiling plate 11 or the connecting part between the convex part 4 and the projecting part 5 can withstand various loads (e.g., weight of the ceiling plate 11, pressure during evacuation of the vacuum chamber 1). The analysis was performed in a case where the pressure difference $\Delta P (\Delta P=Pm-Pn)$ is 1 Torr and 4 Torr wherein "Pm" indicates the pressure between the protection cover (used for protecting the inner wall surface of the vacuum chamber 1 and the ceiling plate 11) and the inner wall surface of the vacuum chamber 1/the ceiling plate 11 and "Pn" indicates the pressure in a processing atmosphere.

As a result, the connecting part between the convex part 4 and projecting part 5 was found to have sufficient strength as illustrated in FIGS. 29 and 30. Further, the strength of the side ring 100 was also found to have sufficient strength.

As illustrated in FIG. 31, the ceiling plate 11 was found to have sufficient strength.

Experiment 3

Next, the amount of the electrical damage received by the wafer W (more specifically, the gate oxide film of a device formed in the wafer W) in accordance with the providing of the faraday shield 95 was evaluated. In experiment 3, plural types (in this experiment, 6 types) of wafers having different tolerance against electrical damage were prepared and subjected to plasma irradiation.

Figure 32:
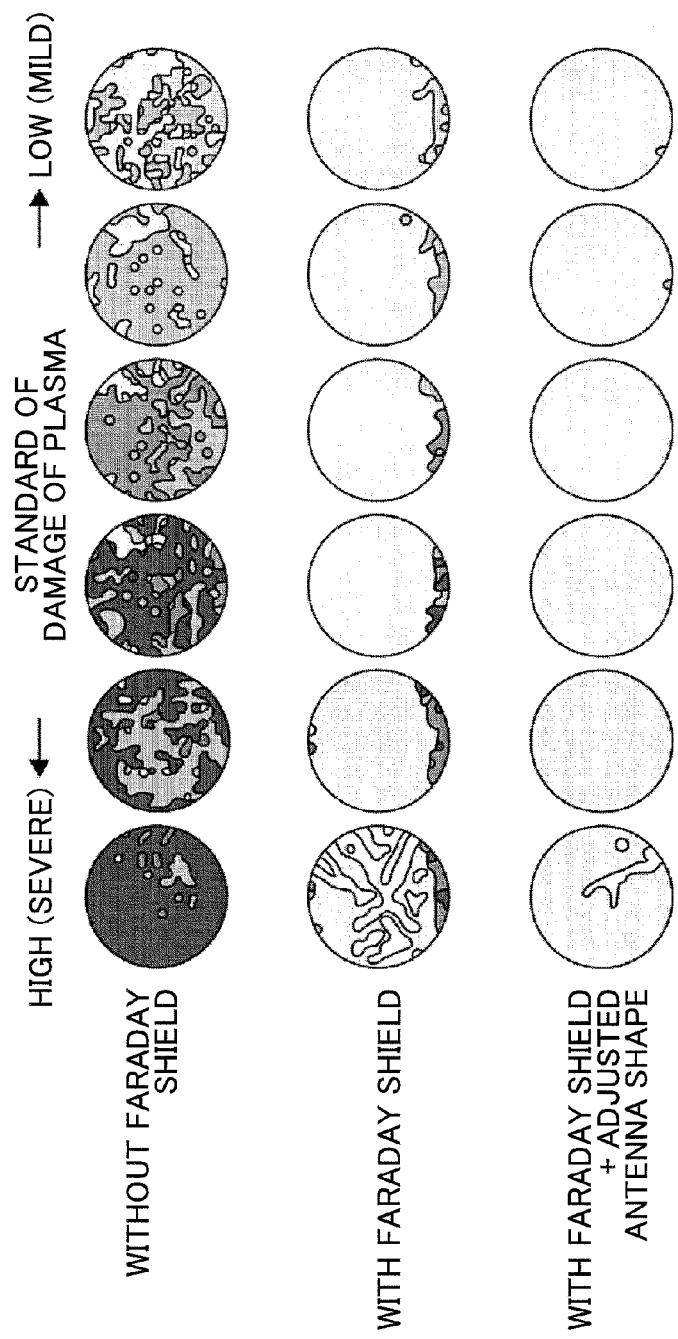

In a case where no faraday shield 95 (top row of FIG. 32) is provided, all of the wafers received electrical damage. It is to be noted that the rightmost wafer in FIG. 32 illustrates the results of a wafer having the largest tolerance against electrical damage, and the tolerance of the wafers against electrical damage becomes more less toward the left of the FIG. 32. In case where the faraday shield 95 is provided (middle row of FIG. 32), all of the wafers exhibits a significant reduction of electrical damage. Accordingly, by providing the faraday shield 95, insulation breakdown (electrical breakdown) of the gate oxide film of the wafer W can be prevented.

In this experiment, because a portion of the antennas 83 were found to have deviated from their original position (i.e. not perpendicular to the orientation of the slits 97), the position of the antennas 83 in the peripheral direction were adjusted to be perpendicular to the orientation of the slits 97. After the adjustment, the experiment was performed again. As a result, hardly any electrical damage was found in the wafers (see bottom row of FIG. 32).

Experiment 4

Next, it was determined how electrical characteristics of the thin film (voltage resistance of oxide film) changes depending on performing of the plasma modification process and providing the faraday shield 95. In other words, voltage was measured by contacting a mercury probe to an oxide film on the surface of the wafer W where electric stress (current) is applied to the oxide film. In a case where a small amount of voltage is measured, the leakage of current is small, and the degree of impurity contained in the oxide film is low.

Figure 33:
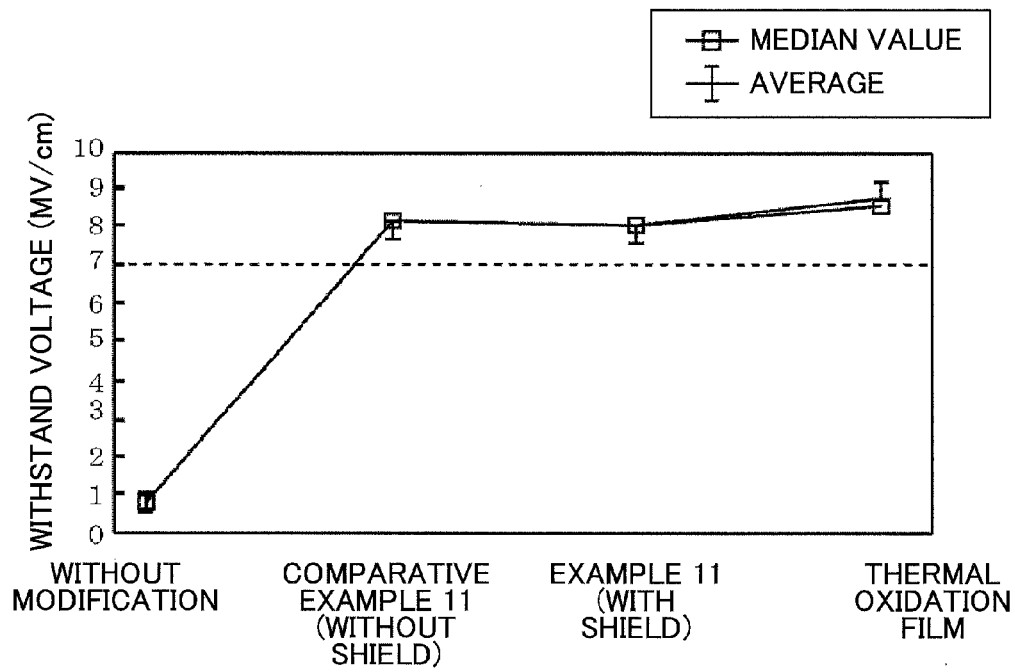
Figure 34:
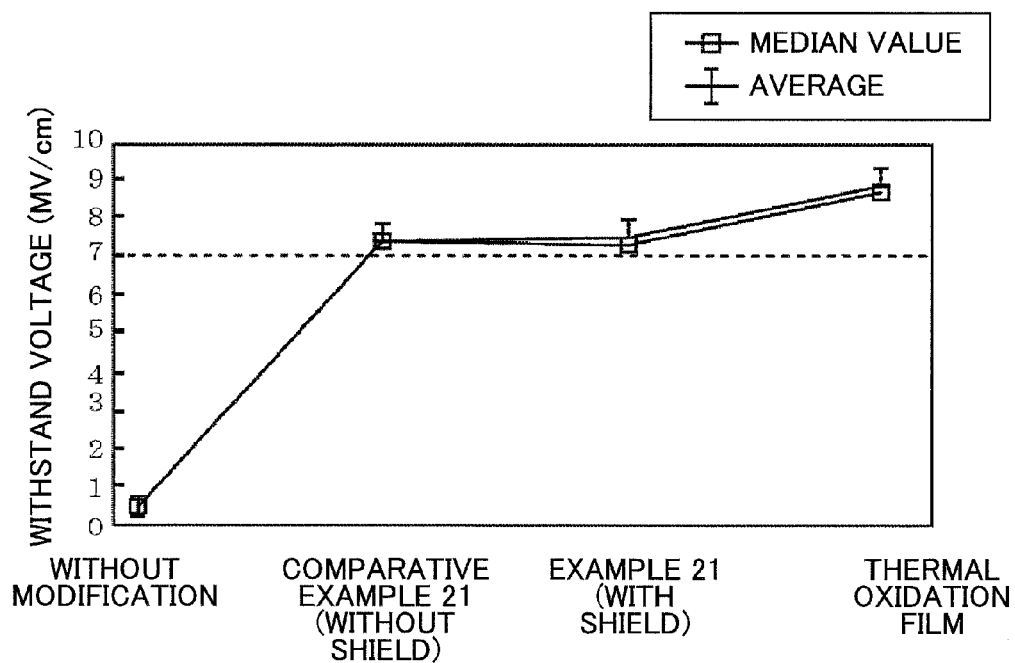

As illustrated in the results of FIGS. 33 and 34, the electrical characteristic of the oxide film is improved by performing the plasma modification process compared to case of not performing the plasma modification process. By performing the plasma modification process, the oxide film exhibited substantially the same electrical characteristic of a thermal oxide film. More specifically, in a case where no plasma modification process is performed, the electric field was 0.4 MV/cm when a current density of $1 \times 10^{-8}$ A/cm$^2$ was applied. In a case where the plasma modification process was performed, the electric field was 8 MV/cm when a current density of $1 \times 10^{-8}$ A/cm$^2$ was applied. Accordingly, it is understood that an oxide film having little impurity density and a small amount of leak current can be obtained by performing the plasma modification process.

In experiment 4, it is also understood that the electric characteristic of the oxide film does not change regardless of whether the faraday shield 95 is provided. Accordingly, it is understood that the faraday shield 95 does not adversely affect the plasma modification process. FIG. 33 illustrates the experiment results where the plasma modification process is performed in a batch (in a single time) after depositing the thin film on the wafer W. FIG. 34 illustrates the experiment results where the plasma modification process is performed once every rotation of the rotation table 2. In experiment 4, the antenna 83 was wound 1 time in a case where no faraday shield 95 was provided, and the antenna 83 was wound approximately 3 times in a case where the faraday shield was provided.

Experiment 5

In experiment 5, the wet etching rate of the thin film was observed. That is, the density of the thin film was measured by referring to the wet etching rate. This is because the wet etching rate decreases as the density of the thin film increases, and the wet etching rate increases the more impurities are contained inside the thin film. In experiment 5, the film thickness of the thin film formed on the wafer was measured after etching the thin film by steeping the wafer in a hydrofluoric acid solution.

Figure 35:
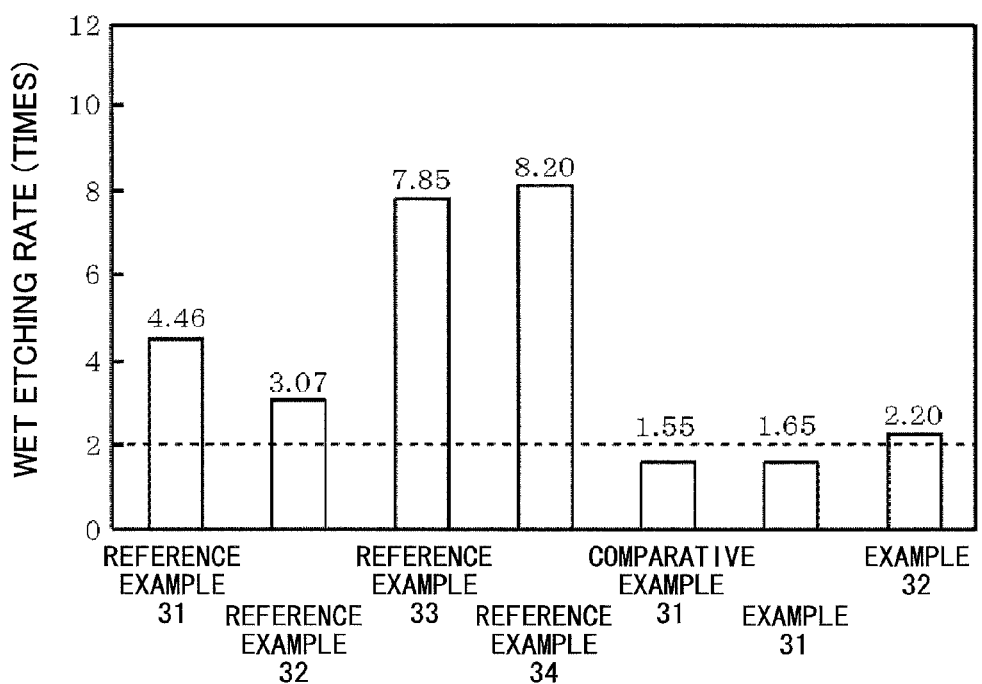

As illustrated in the results of FIG. 35, compared to performing a thin film deposition process without performing plasma modification after the thin film deposition process (see reference examples in FIG. 35), densification of the thin film was achieved by performing the thin film deposition process and then performing the plasma modification process. The film characteristics was substantially the same between a case of providing no faraday shield 95 (comparative example in FIG. 35) and a case of providing the faraday shield 95 (examples 31 and 32 in FIG. 35).

Thus, according to the results of experiment 5, it is understood that the faraday shield 95 does not adversely affect the plasma modification process. In FIG. 35, example 31 indicates a case where the plasma modification process was performed per rotation of the rotation table 2, and example 32 indicates a case of forming a multilayer reaction product on the wafer by rotating the rotation table 2 for 9 times, then stopping the supply of each of the process gases, and then performing the plasma modification process on the wafer. In experiment 5, the antenna 83 was wound 1 time in a case where no faraday shield 95 was provided, and the antenna 83 was wound approximately 3 times in a case where the faraday shield was provided.

Figure 36:
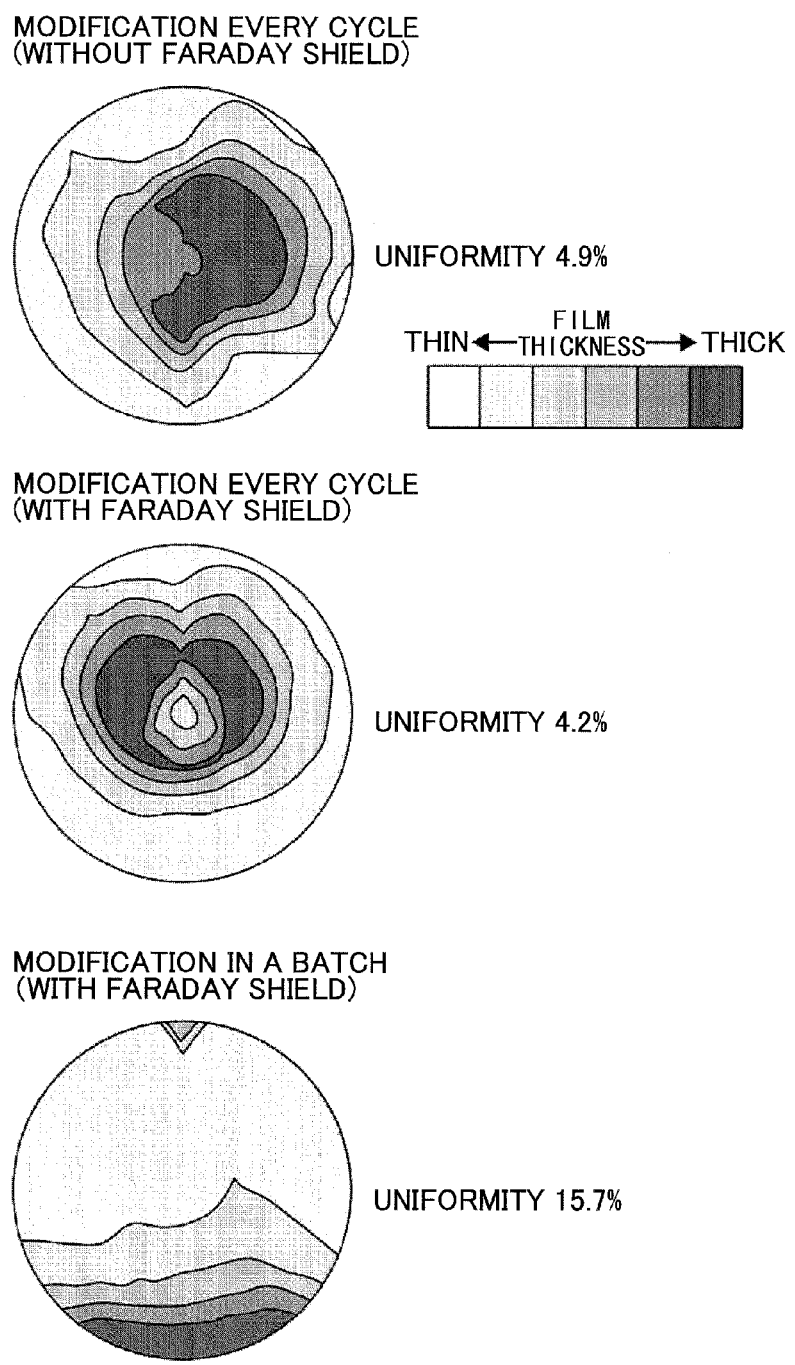

FIG. 36 illustrates distribution of film thickness of a thin film after being subjected to wet etching. It is understood that the film thickness of the thin film hardly changes regardless of whether the faraday shield 95 is provided.

Experiment 6

Figure 37:
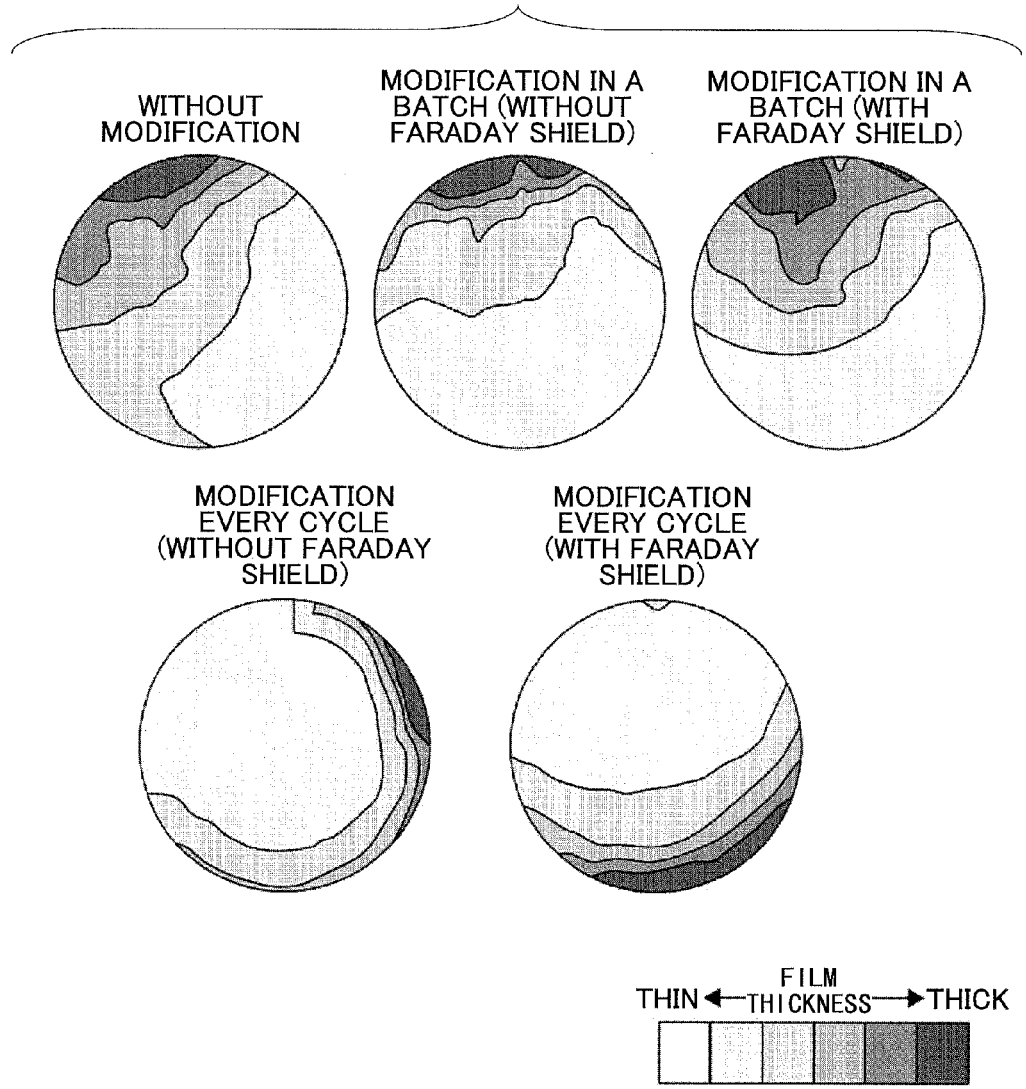

FIG. 37 illustrates the results of evaluating whether uniformity (consistency) of film thickness can be attained depending on whether the faraday shield 95 is provided. In the top row of FIG. 37, the experiment results of the leftmost wafer in the top row of FIG. 37 illustrates a case where no plasma modification was performed, the experiment results of the middle wafer in the top row of FIG. 37 illustrates a case where plasma modification was performed in a batch without the faraday shield 95 being provided, and the experiment results of the rightmost wafer in the top row of FIG. 37 illustrates a case where plasma modification was performed in a batch with the faraday shield 95 provided. According to the experiment results, it is understood that the plasma modification process is performed so that the distribution of film thickness is substantially the same as the distribution of film thickness after performing the film deposition process. That is, the distribution of film thickness hardly changes by performing the plasma modification process. Further, in the bottom row of FIG. 37, the experiment results on the left side of FIG. 37 illustrates a case where plasma modification was performed every cycle without the faraday shield 95 provided, and the experiment results on the right side of FIG. 37 illustrates a case where plasma modification was performed every cycle with the faraday shield 95 provided.

Experiment 7

Figure 38:
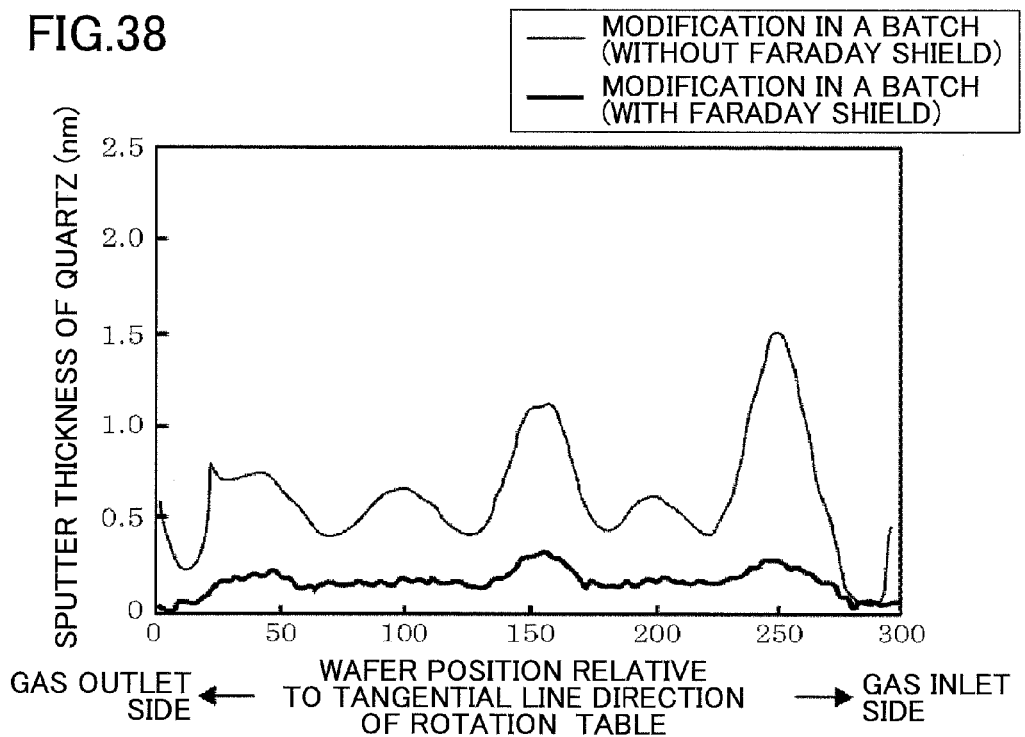

An experiment was performed on how the amount of sputter of quartz changes depending on whether the faraday shield 95 is provided. In experiment 7, no process gas was supplied. That is, without forming any thin film, a wafer W is passed through the plasma space 10 by rotating the rotation table 2. As a result, compared to a case without the faraday shield 95 being provided, the amount of sputter of quartz has significantly decreased with the faraday shield 95 being provided (see FIG. 38).

Figure 39:
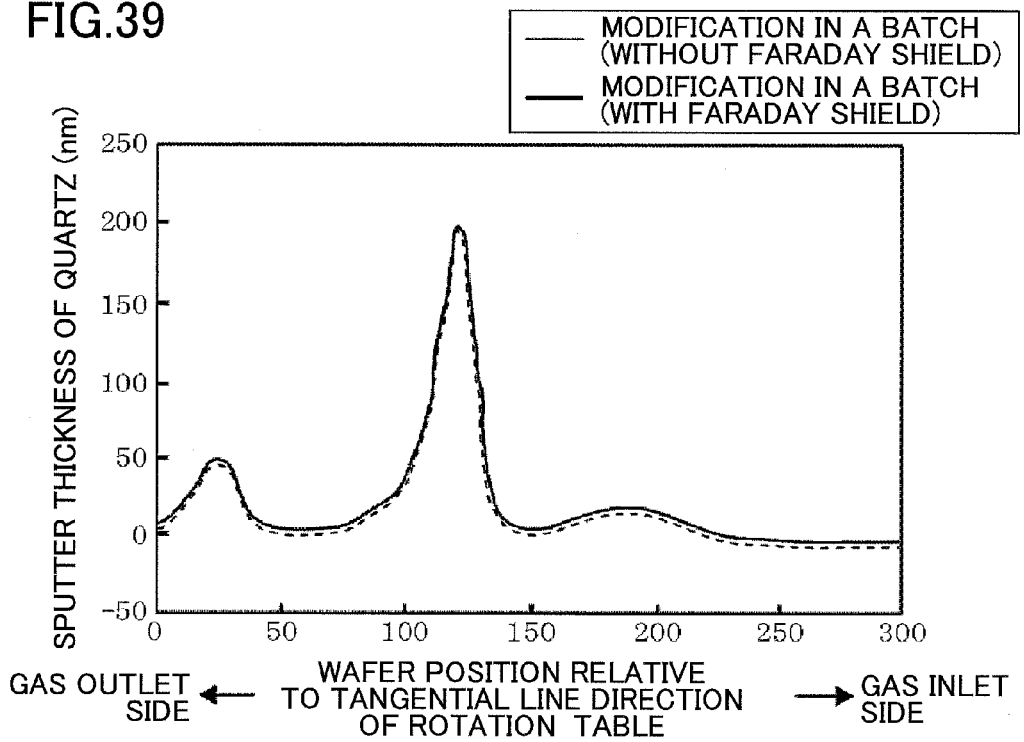

In performing the same experiment using the a CCP type plasma generation part (i.e. a type of plasma generation device that generates plasma with a pair of electrodes), the results illustrated in FIG. 39 was obtained. Accordingly, by using the CCP type plasma generation type having an antenna 83 including a coil structure, the amount of sputter of quartz can be reduced in an order of approximately 100 times.

Experiment 8

Figure 40:
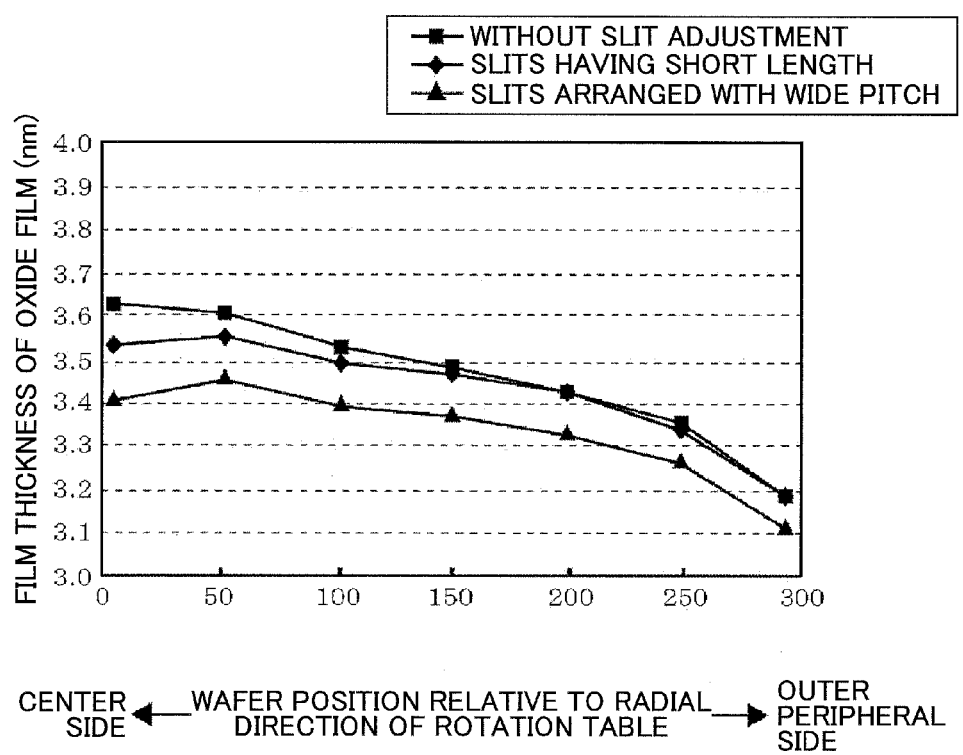

FIG. 40 illustrates how the degree of plasma modification is different when comparing a case of using the faraday shield 95 illustrated in FIG. 23 (an embodiment without adjusting the arrangement of slits 97) with respect to a case of using the faraday shield 95 illustrated in FIG. 24 (an embodiment using supplementary slits 97a being shorter than the other slits 97) and the faraday shield 95 illustrated in FIG. 25 (an embodiment having the slits 97 arranged with a widened pitch). In experiment 8, no supplying of process gas was performed. That is, only plasma was generated by supplying plasma generation gas (Ar gas, $O_2$ gas, and $NH_3$ gas). For confirming the amount of exposure of plasma on the wafer W, measurement of film thickness of the oxide film (formed by oxidizing the surface (silicon surface) of the wafer W with plasma) was performed on plural parts of the wafer with respect to the radial direction of the rotation table 2.

As a result, it was found that attaining of uniform film thickness in the radial direction of the rotation table 2 can be improved by adjusting the arrangement of the slits 97. That is, by reducing the size (area) of the opening of the slits 97 toward the center of the rotation table 2, the film thickness of the oxide film toward the center of the rotation table 2 decreased. Further, it was found that the smaller the size of the opening of the slits 97, the film thickness can be more uniform (consistent). That is, the film thickness of the oxide film of the embodiments in FIGS. 23, 24, and 25 becomes more consistent in this order. Accordingly, even in a case where the film deposition process of a reaction product and the plasma modification process of the reaction product are performed, the degree of plasma modification can be uniform (consistent) in the radial direction of the rotation table 2.

Further, the present invention is not limited to these embodiments, but variations and modifications may be made without departing from the scope of the present invention.

What is claimed is:
1. A film deposition apparatus comprising:
a vacuum chamber into which first and second process gases are sequentially supplied for a plural number of times, the vacuum chamber including;
a rotation table that includes a first surface having a substrate receiving area and configured to rotate the substrate receiving area inside the vacuum chamber;
a first process gas supply part that supplies the first process gas to a first process region;
a second process gas supply part that supplies the second process gas to a second process region separated from the first process region in a peripheral direction of the rotation table via a separation region;
a plasma generation gas nozzle that supplies a plasma generation gas into a plasma region inside the vacuum chamber; and
a plasma generation part including
an antenna that faces the first surface of the rotation table and is configured to generate plasma from the plasma generation gas supplied from the plasma generation gas nozzle into the plasma space by inductive coupling;
a faraday shield that is grounded and provided between the antenna and a substrate placed in the plasma space, the faraday shield including a plurality of slits that are provided at a bottom surface of the faraday shield and aligned in a direction perpendicularly intersecting the antenna and a side wall that is provided at a perimeter of the bottom surface so as to extend in a direction perpendicular to the bottom surface and cover a peripheral side of the antenna, said bottom surface and the side wall being made of a same material, said plurality of slits being provided only at the bottom surface and being not provided at the side wall, and
an insulating plate provided on the bottom surface of the faraday shield so as to be interposed between the antenna and the faraday shield,
wherein the side wall and the bottom surface of the faraday shield are integrally formed as one body,
wherein the faraday shield has a sector shape from a plan view;
wherein the plasma generation part has a sector shape corresponding to the sector shape of the faraday shield, and
wherein the faraday shield provided between the antenna and the substrate is configured to prevent an electric field from reaching the substrate by way of the plurality of slits that are formed below the antenna, aligned in a direction perpendicularly intersecting the antenna.

2. The film deposition apparatus as claimed in claim 1, wherein the faraday shield is formed of a conductive plate member.

3. The film deposition apparatus as claimed in claim 1, further comprising:
a dielectric member that hermetically separates the antenna and the faraday shield from the plasma space.

4. The film deposition apparatus as claimed in claim 1, further comprising:
a housing formed of a dielectric material;
a ceiling plate including an opening part communicating with the rotation table via the housing; and
a sealing member that connects the housing and the ceiling plate;
wherein the housing has the antenna installed therein,
wherein the opening part includes an opening rim part,
wherein the sealing member is formed in the opening rim part.

5. The film deposition apparatus as claimed in claim 4, further comprising:
a separation gas supply part that supplies a separation gas to the separation region; and
a projecting part that extends downward from a peripheral part of a bottom surface of the housing;
wherein the projecting part is configured to prevent the first process gas, the second process gas, and the separation gas from entering an area below the housing.

6. The film deposition apparatus as claimed in claim 1, further comprising:
an air stream flow path provided between a periphery of the rotation table and an inner wall of the vacuum chamber;
a cover body having an annular shape and covering the air stream flow path, the cover body including first and second evacuation ports communicating with the air stream flow path;
wherein the first evacuation port is positioned on a downstream side of the first process region with respect to a rotation direction of the rotation table,
wherein the second evacuation port is positioned on a downstream side of the plasma region with respect to the rotation direction of the rotation table.

7. The film deposition apparatus as claimed in claim 1, wherein the antenna includes a coil structure, wherein the antenna has a sector shape that becomes wider in a direction from a rotation center of the rotation table to an outer periphery of the rotation table.

8. The film deposition apparatus as claimed in claim 1, wherein the plasma generation part includes a gas nozzle extending in a radial direction of the rotation table and having a plurality of gas ejection ports,
wherein the plasma generation part is positioned below an area below the housing and at an upstream side of the housing with respect to a rotation direction of the rotation table,
wherein each of the plural gas ejection ports face the upstream side.

9. The film deposition apparatus as claimed in claim 1, wherein the plural slits has an opening in which a size of the opening becomes smaller toward an outer rim side of the rotation table.

10. The film deposition apparatus as claimed in claim 1, wherein the side wall is provided so as to vertically extend from the bottom surface of the faraday shield toward the antenna.

11. The film deposition apparatus as claimed in claim 1, wherein the faraday shield including the bottom surface and the side wall is made of one of Ag and Al.

12. A film deposition apparatus comprising:
a vacuum chamber into which first and second process gases are sequentially supplied for a plural number of times, the vacuum chamber including;
a rotation table that includes a first surface having a substrate receiving area and configured to rotate the substrate receiving area inside the vacuum chamber;
a first process gas supply part that supplies the first process gas to a first process region;
a plasma generation gas nozzle that supplies the second process gas to a second process region separated from the first process region in a peripheral direction of the rotation table via a separation region and supplies a plasma generation gas into a plasma region inside the vacuum chamber;
a plasma generation part including
an antenna that faces the first surface of the rotation table and is configured to generate plasma from the plasma generation gas supplied from the plasma generation gas nozzle into the plasma space by inductive coupling;
a faraday shield that is grounded and provided between the antenna and a substrate placed in the plasma space, the faraday shield including a plurality of slits that are provided at a bottom surface of the faraday shield and aligned in a direction perpendicularly intersecting the antenna and a side wall that is provided at a perimeter of the bottom surface so as to extend in a direction perpendicular to the bottom surface and cover a peripheral side of the antenna, said bottom surface and the side wall being made of a same material, said plurality of slits being provided only at the bottom surface and being not provided at the side wall, and
an insulating plate provided on the bottom surface of the faraday shield so as to be interposed between the antenna and the faraday shield,
wherein the side wall and the bottom surface of the faraday shield are integrally formed as one body,
wherein the faraday shield provided between the antenna and the substrate is configured to prevent an electric field from reaching the substrate by way of the plurality of slits that are formed below the antenna, aligned in a direction perpendicularly intersecting the antenna,
wherein the faraday shield has a sector shape from a plan view; and
wherein the plasma generation part has a sector shape corresponding to the sector shape of the faraday shield.

13. The film deposition apparatus as claimed in claim 12, wherein the faraday shield is formed of a conductive plate member.

14. The film deposition apparatus as claimed in claim 12, further comprising:
a dielectric member that hermetically separates the antenna and the faraday shield from the plasma space.

15. The film deposition apparatus as claimed in claim 12, further comprising:
a housing formed of a dielectric material;
a ceiling plate including an opening part communicating with the rotation table; and
a sealing member that connects the housing and the ceiling plate;
wherein the housing has the antenna installed therein,
wherein the opening part includes an opening rim part, wherein the sealing member is formed in the opening rim part.

16. The film deposition apparatus as claimed in claim 15, further comprising:
a separation gas supply part that supplies a separation gas to the separation region; and
a projecting part that extends downward from a peripheral part of a bottom surface of the housing;
wherein the projecting part is configured to prevent the first process gas, the second process gas, and the separation gas from entering an area below the housing.

17. The film deposition apparatus as claimed in claim 15,
wherein the plasma generation part includes a gas nozzle extending in a radial direction of the rotation table and having a plurality of gas ejection ports,
wherein the plasma generation part is positioned below an area below the housing and at an upstream side of the housing with respect to a rotation direction of the rotation table,
wherein each of the plural gas ejection ports face the upstream side.

18. The film deposition apparatus as claimed in claim 12, further comprising:
an air stream flow path provided between a periphery of the rotation table and an inner wall of the vacuum chamber;
a cover body having an annular shape and covering the air stream flow path, the cover body including first and second evacuation ports communicating with the air stream flow path;
wherein the first evacuation port is positioned on a downstream side of the first process region with respect to a rotation direction of the rotation table,
wherein the second evacuation port is positioned on a downstream side of the plasma region with respect to the rotation direction of the rotation table.

19. The film deposition apparatus as claimed in claim 12, wherein the antenna includes a coil structure, wherein the antenna has a sector shape that becomes wider in a direction from a rotation center of the rotation table to an outer periphery of the rotation table.

20. The film deposition apparatus as claimed in claim 12, wherein the plural slits has an opening in which a size of the opening becomes smaller toward an outer rim side of the rotation table.

\* \* \* \* \*